(12) United States Patent
Yang

(10) Patent No.: US 10,164,051 B2
(45) Date of Patent: Dec. 25, 2018

(54) METHOD OF CUTTING METAL GATE

(71) Applicant: Taiwan Semiconductor Manufacturing Company, Ltd., Hsin-Chu (TW)

(72) Inventor: Kai-Chieh Yang, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 35 days.

(21) Appl. No.: 14/942,657

(22) Filed: Nov. 16, 2015

(65) Prior Publication Data

US 2017/0141210 A1    May 18, 2017

(51) Int. Cl.
    *H01L 29/66*    (2006.01)
    *H01L 21/8234*   (2006.01)

(52) U.S. Cl.
    CPC .......... *H01L 29/66545* (2013.01); *H01L 21/823431* (2013.01); *H01L 21/823437* (2013.01); *H01L 21/823468* (2013.01); *H01L 21/823481* (2013.01)

(58) Field of Classification Search
    CPC ....... H01L 29/66545; H01L 21/823431; H01L 21/823437; H01L 21/823468; H01L 21/823481; H01L 21/3205; H01L 21/28; H01L 29/51; H01L 21/823821; H01L 21/823828
    See application file for complete search history.

(56) References Cited

U.S. PATENT DOCUMENTS

| | | | |
|---|---|---|---|
| 7,667,271 | B2 | 2/2010 | Yu et al. |
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 2014/0110755 | A1 | 4/2014 | Colinge |
| 2014/0151812 | A1 | 6/2014 | Liaw |

(Continued)

*Primary Examiner* — William F Kraig
*Assistant Examiner* — Khatib Rahman
(74) *Attorney, Agent, or Firm* — Haynes and Boone, LLP

(57) ABSTRACT

A method for fabricating a semiconductor device includes forming a first fin and a second fin on a substrate, forming a first metal-gate line over a first and a second gate regions, applying a first line-cut to separate the first metal-gate line into a first sub-metal gate line and a second sub-metal gate line and forming a second metal-gate line over the first sub-metal gate line and the second sub-metal gate line, applying a second line-cut to separate the second metal-gate line into a third sub-metal gate line and a fourth sub-metal gate line such that a gap is formed between the third sub-metal gate line and the fourth sub-metal gate line and forming an isolation region within the gap.

20 Claims, 23 Drawing Sheets

(56) References Cited

U.S. PATENT DOCUMENTS

2014/0264628 A1\* 9/2014 Lin .................... H01L 27/0808
                                                                    257/401
2016/0071944 A1\* 3/2016 Lu .................... H01L 29/42376
                                                                    257/392

\* cited by examiner

METHOD OF CUTTING METAL GATE

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

One advancement implemented as technology nodes shrink, in some IC designs, has been the replacement of the typically polysilicon gate electrode with a metal gate electrode to improve device performance with the decreased feature sizes. Although existing methods of fabricating IC devices have been generally adequate for their intended purposes, they have not been entirely satisfactory in all respects. For example, challenges rise in cutting a metal electrode line into sub-meta-electrode lines.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
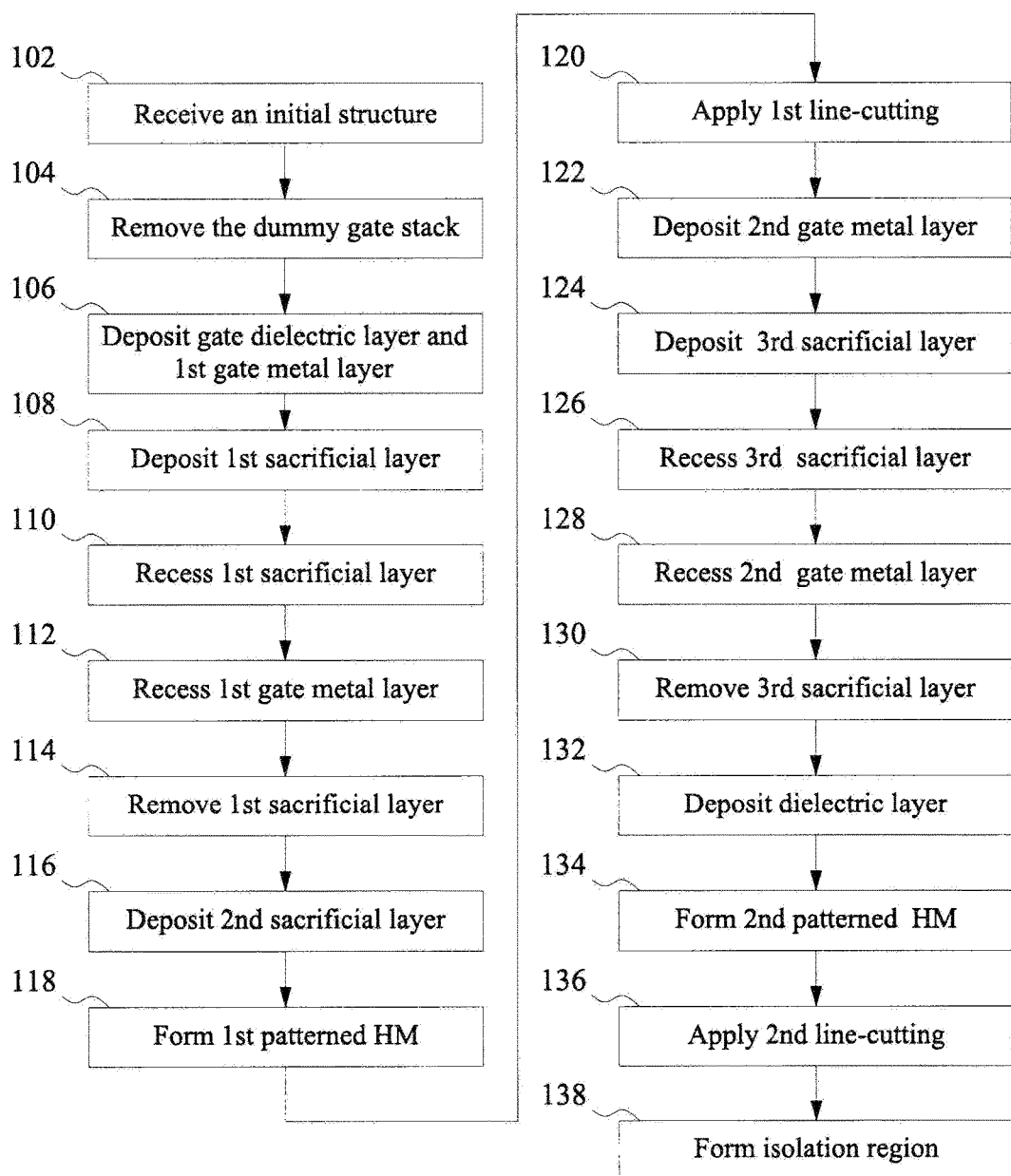
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly, The present disclosure is directed to, but not otherwise limited to, a fin-like field-effect transistor (FinFET) device. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration, One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (π-gate) devices. The following disclosure will continue with a FinFET example to illustrate various embodiments of the present invention. It is understood, however, that the application is not limited to a particular type of device.

FIG. 1 is a flowchart of a method 100 of fabricating one or more semiconductor devices in accordance with some embodiments. Method 100 is discussed in detail below, with reference to a workpiece of a semiconductor device shown in FIGS. 2A through 2C and the semiconductor device shown in FIGS. 3A through 20B.

Referring to FIGS. 1, 2A, 2B and 2C, method 100 starts at step 102 by receiving a workpiece 205 of the semiconductor device 200. The workpiece 205 includes a substrate 210. The substrate 210 may be a bulk silicon substrate. Alternatively, the substrate 210 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, and/or using a raised structure. The substrate 210 may further include various active regions, such as regions configured for an N-type metal-oxide-semiconductor transistor device and regions configured for a P-type metal-oxide-semiconductor transistor device.

The substrate 210 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The workpiece 205 also includes a plurality of fin features 230 formed over the substrate 210. The fin feature 230 may include Si, SiGe, silicon germanium tin (SiGeSn), GaAs, InAs, InP, or other suitable materials. In some embodiments, the fin feature 230 is formed by any suitable process including various deposition, photolithography, and/or etching processes. As an example, the fin feature 230 is formed by patterning and etching a portion of the substrate 210.

The workpiece 205 also includes a plurality of gate stacks 240 in a gate region 242 over the substrate 210, including wrapping over a portion of the fin features 230. In the present embodiment, the gate stack 240 is a dummy gate stack, which will be replaced later by high-k/metal gate (HK/MG). The dummy gate stack 240 may include a dielectric layer, a polysilicon layer. The dummy gate stack 240 may be formed by any suitable process or processes, such as deposition, patterning and etching.

Sidewall spacers 245 are formed along the sidewalls of the dummy gate stack 240. The sidewall spacers 245 may include a dielectric material such as silicon oxide. Alternatively, the sidewall spacers 245 may include silicon nitride, silicon carbide, silicon oxynitride, or combinations thereof. The sidewall spacers 245 may be formed by depositing a gate sidewall spacer layer and then anisotropic dry etching the gate sidewall spacer layer.

The workpiece 205 also includes source/drain (S/D) features 250 in source/drain regions 252 over the substrate 210, beside the dummy gate stack 240 (with the sidewall spacers 245). In some embodiments, the source/drain feature 250 is a source feature, and another source/drain feature 250 is a drain feature. The source/drain features 250 are separated by the dummy gate stack 240. In one embodiment, a portion of the fin feature 230, beside the dummy gate stack 240 is recessed to form S/D recesses and then the S/D features 250 are formed over the S/D recesses by epitaxial growing processes, including chemical vapor deposition (CVD) deposition techniques (e.g., vapor-phase epitaxy (VPE) and/or ultra-high vacuum CVD (UHV-CVD)), molecular beam epitaxy, and/or other suitable processes. The S/D features 250 may include Ge, Si, GaAs, aluminum gallium arsenide (AlGaAs), SiGe, gallium arsenide phosphide (GaAsP), GaSb, InSb, indium gallium arsenide (InGaAs), InAs, or other suitable materials. After the S/D recesses are filled with the S/D feature 250, further epitaxial growth of a top layer of the S/D features 250 expands horizontally and facets may start to form, such as a diamond shape facets. The S/D features 250 may be in-situ doped during the epi processes. In some embodiments, the S/D feature 250 is not in-situ doped, an implantation process (i.e., a junction implant process) is performed to dope the S/D feature 250. One or more annealing processes may be performed to activate dopants. The annealing processes comprise rapid thermal annealing (RTA) and/or laser annealing processes.

The workpiece 205 also includes an interlayer dielectric (ILD) layer 260 deposited over the substrate 210, including between/over each of the dummy gate stack 240 and over the S/D features 250. The ILD layer 260 may be deposited by CVD, atomic layer deposition (ALD), spin-on coating, or other suitable techniques. The ILD layer 260 may include silicon oxide, silicon nitride, oxynitride, a dielectric material having a dielectric constant (k) lower than thermal silicon oxide (therefore referred to as low-k dielectric material layer), and/or other suitable dielectric material layer. The ILD layer 260 may include a single layer or multiple layers. A CMP may be performed to polish back the ILD layer 260 to expose a top surface of the dummy gate stack 240.

Figure 2A:
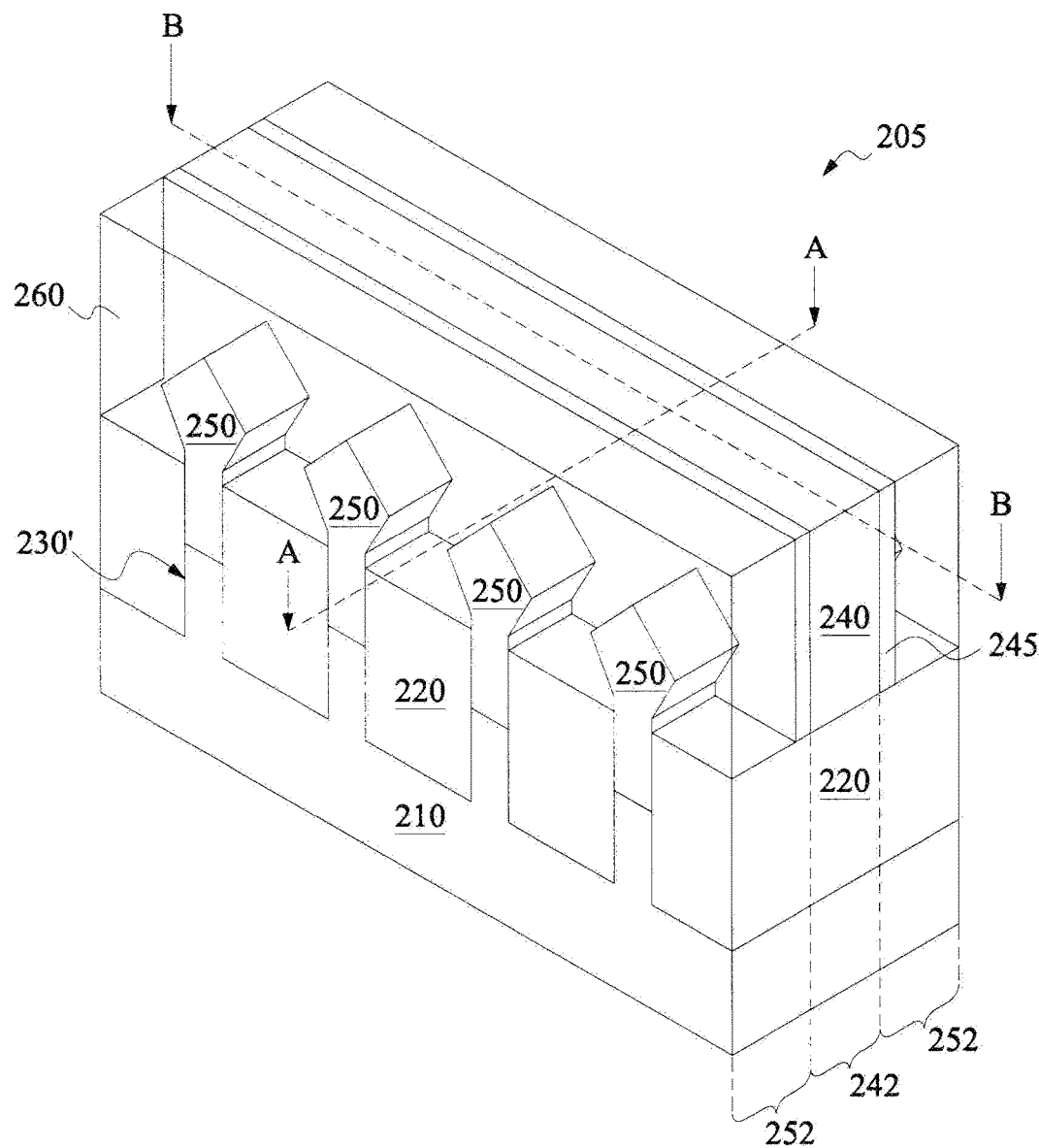
FIG. 2A is a diagrammatic perspective view of an example of a work piece of a semiconductor device in accordance with some embodiments.
Figure 2B:
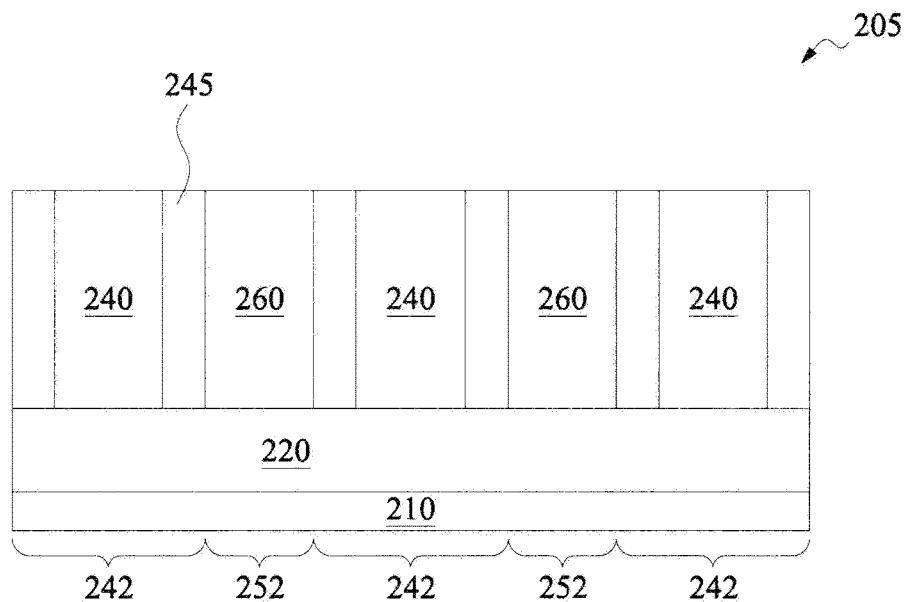
FIG. 2B is a cross-sectional view of an example of a work piece of a semiconductor device along the line A-A in FIG. 2A.
Figure 2C:
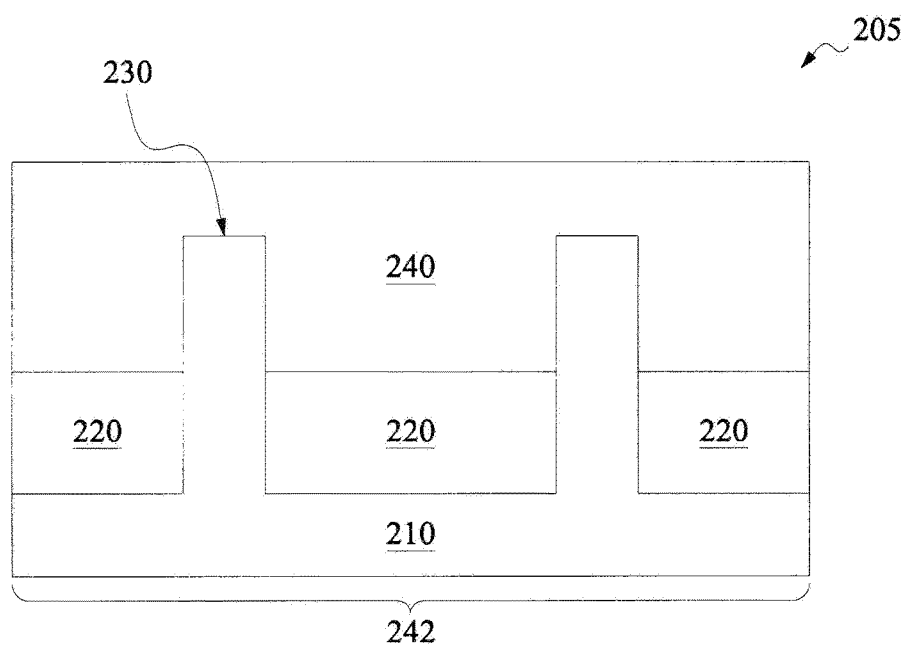
FIG. 2C is a cross-sectional view of an example of a work piece of a semiconductor device along the line B-B in FIG. 2A.

It is noted that FIG. 2B is a cross-sectional view of the workpiece 205 along the line A-A in FIG. 2A, which locates between two S/D features 250. FIG. 2C is a cross-section view of the workpiece 205 along the line B-B, which is perpendicular to the line A-A and locates in the gate region 242.

Figure 3A:
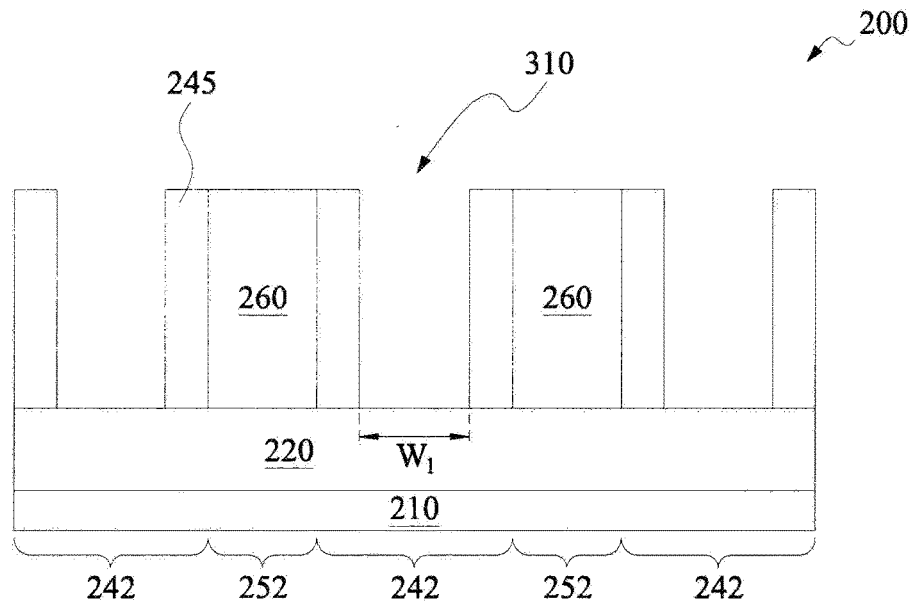
FIGS. 3A, 4A, 5A, 6A, 7A, 8A, 9A, 10A, 11A, 11C, 12A, 13A, 14A, 15A, 16A, 17A, 18A, 19A, 19C and 20A are cross-sectional views of an example semiconductor device in accordance with some embodiments, along the line A-A in FIG. 2A.
Figure 3B:
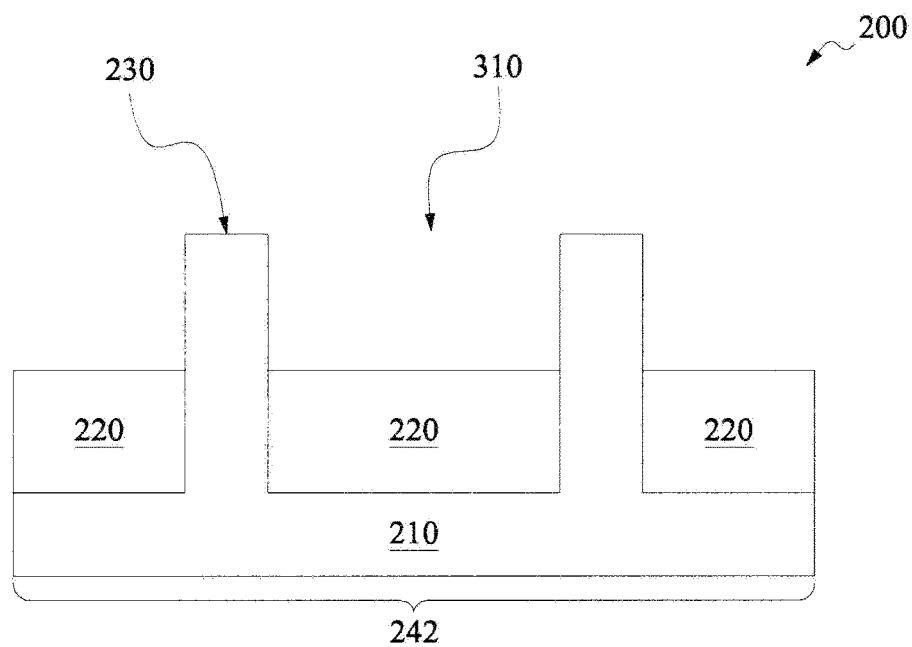
FIGS. 3B, 4B, 5B, 6B, 7B, 8B, 9B, 10B, 11B, 11D, 12B, 13B, 14B, 15B, 16B, 17B, 18B, 19B, 19D and 20B are cross-sectional views of an example semiconductor device in accordance with some embodiments, along the line B-B in FIG. 2A.

Referring to FIGS. 1, 3A and 3B, once the workpiece 205 is received, method 100 proceeds to step 104 by removing the dummy gate stack 240 to form gate trenches 310 with a first width $w_1$ along direction of line A-A. In some embodiments, the etching processes may include a selective wet etch and/or a selective dry etch, having an adequate etch selectivity with respect to the fin feature 230, the sidewall spacer 245 and the ILD layer 260. In one embodiment, a selective wet etching solution includes a tetramethylammonium hydroxide (TMAH), a $HF/HNO_3/CH_3COOH$ solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching may also be performed anisotropically using such mechanism as DRIE (deep reactive-ion etching). Alternatively, the dummy gate stacks 240 may be removed by a series of processes including photolithography patterning and etching back.

Figure 4A:
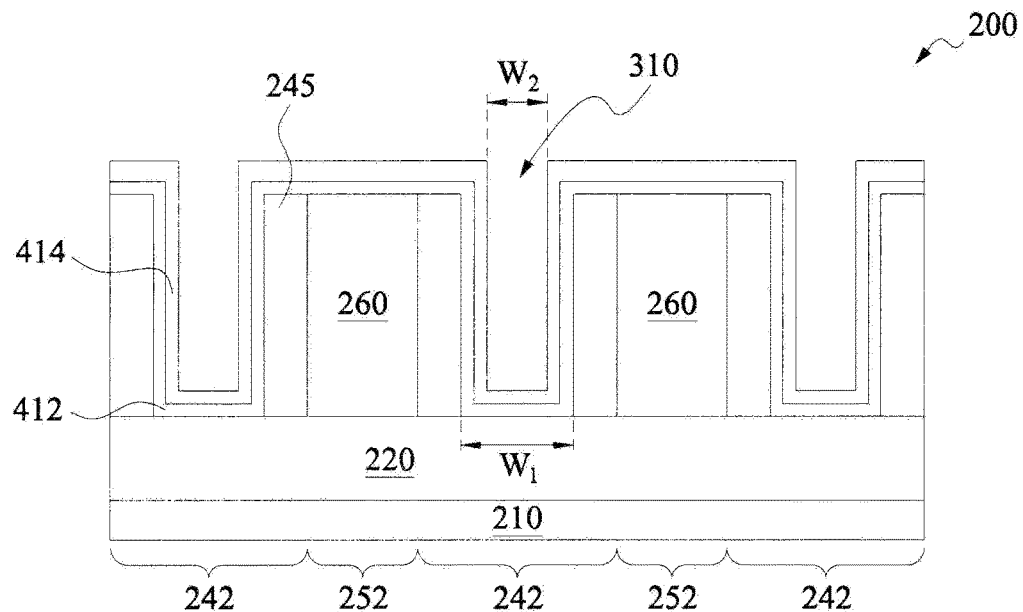
Figure 4B:
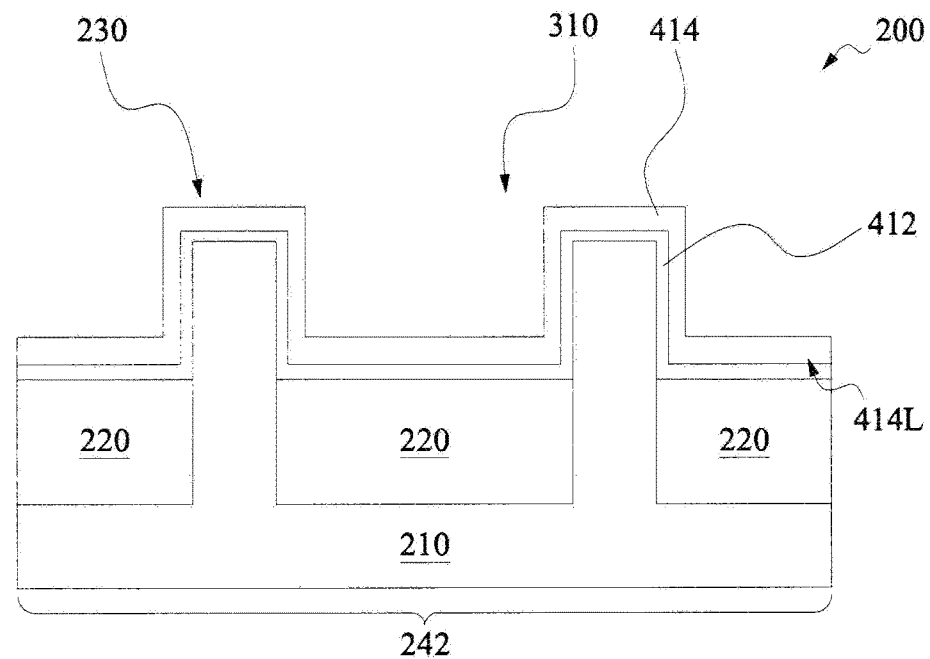

Referring to FIGS. 1, 4A and 4B, method 100 proceeds to step 106 by depositing a gate dielectric layer 412 in the gate trenches 310, including wrapping over upper portions of the fin features 230, and a first gate metal layer 414 over the gate dielectric layer 412. In some embodiments, the first gate metal layer 414 may include a work function (WF) metal layer to enhance the device performance (work function metal layer). The first gate metal layer 414, along the direction of line B-B, continually extends from one fin feature 230 to another fin feature 230 to form a first MG line 414L.

In various embodiments, the gate dielectric layer 412 may include an interfacial layer, a high-K dielectric layer formed over the interfacial layer. High-K dielectrics, as used and described herein, include dielectric materials having a high dielectric constant, for example, greater than that of thermal silicon oxide (~3.9). In some embodiments, the interfacial layer may include a dielectric material such as silicon oxide ($SiO_2$), HfSiO, and/or silicon oxynitride (SiON). The interfacial layer may be formed by chemical oxidation, thermal oxidation, ALD, CVD, and/or other suitable method. The HK dielectric layer may include $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, and/or other suitable material. The high-K gate dielectric layer 412 may be formed by ALD, PVD, CVD, oxidation, and/or other suitable methods.

In the present embodiment, the first gate metal layer 414 is a first portion of a final gate metal layer. The first gate metal layer 414 may include a single layer or alternatively a multi-layer structure, such as various combinations of a metal layer a liner layer, a wetting layer, and/or an adhesion layer. By way of example, the first gate metal layer 414 may include Ti, TiAlN, TaC, TaCN, TaSiN, TiN, TaN, other suitable metal materials and/or a combination thereof. In various embodiments, the first gate metal layer 414 may be formed by ALD, PVD, CVD, e-beam evaporation, or other suitable process. Further, the first gate metal layer 414 may be formed separately for N-FET and P-FET transistors which may use different metal layers.

After forming the gate dielectric layer 412 and the first gate metal layer 414, the first width $w_1$ of the gate trenches 310 reduces to a second width $w_2$, as shown in FIG. 4A. In the present embodiment, by choosing the thickness of the first gate metal layer 414, a ratio of the second width $w_2$ to the first width w1 is greater than 0.5.

Figure 5A:
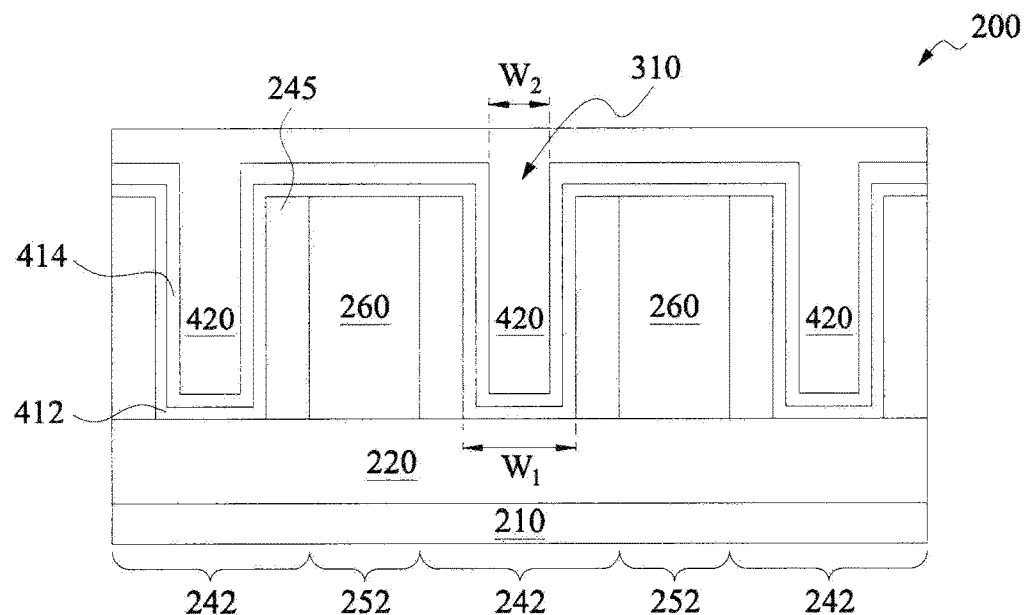
Figure 5B:
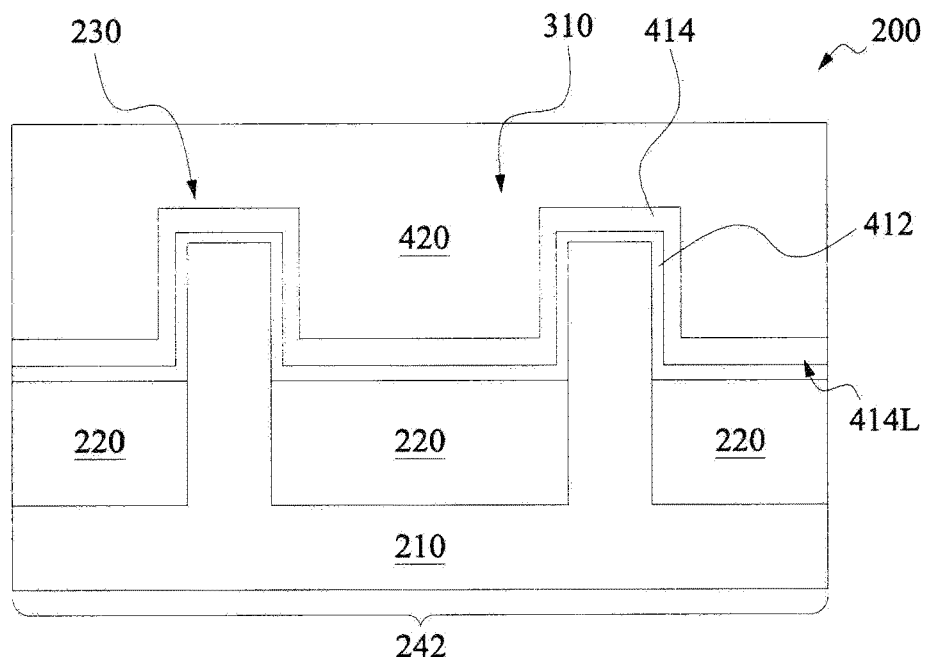

Referring to FIGS. 1, 5A and 5B, method 100 proceeds to step 108 by depositing a first sacrificial layer 420 over the first gate metal layer 414, including filling in the remaining gate trenches 310. The first sacrificial layer 420 may include spin-on glass, bottom anti-reflective coating (BARC), silicon oxide, silicon nitride, oxynitride, silicon carbide, and/or other suitable materials. A BARC layer may include an organic BARC or an inorganic BARC layer. In some embodiments, the first sacrificial layer 420 includes a material which is different from the sidewall spacers 245 and the ILD 260 to achieve etching selectivity subsequent etches. The first sacrificial layer 420 may be deposited by spin-on coating, CVD, PVD, ALD, or other suitable techniques. In an embodiment, the first sacrificial layer 420 fully fills in the gate trenches 310.

Figure 6A:
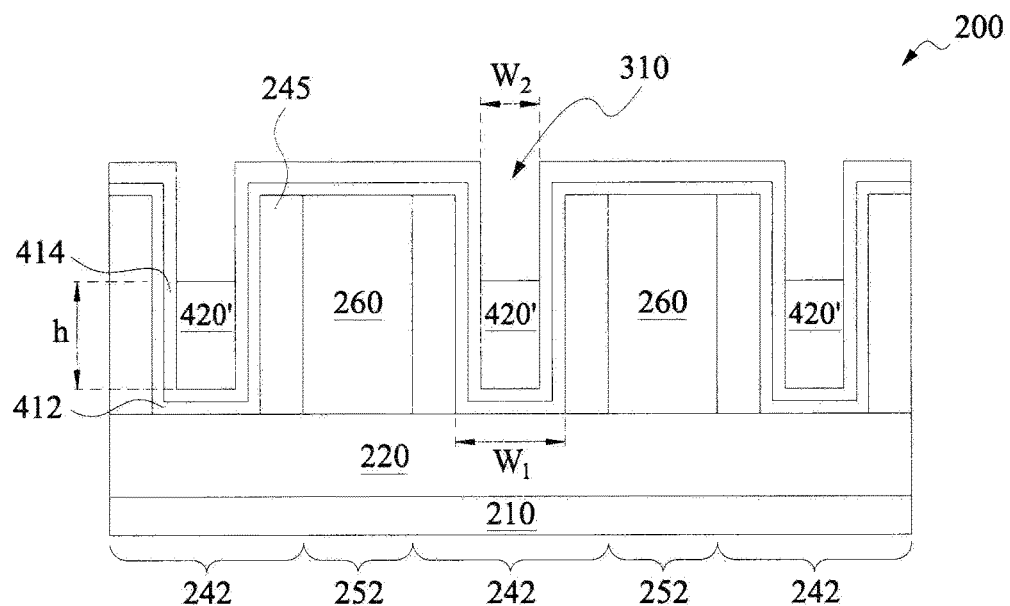
Figure 6B:
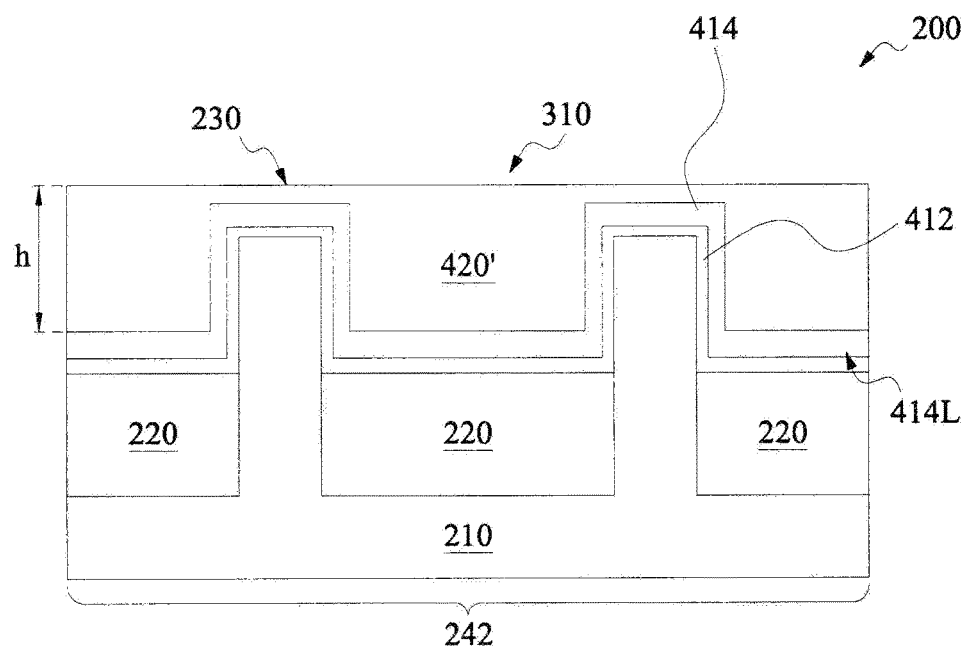

Referring to FIGS. 1, 6A and 6B, method 100 proceeds to step 110 by recessing the first sacrificial layer 420. The etch process may include a wet etch, a dry etch, and/or a combination thereof. For example, dry etching processes may include a biased plasma etching process that uses etchant gasses including $CF_4$, $NF_3$, $SF_6$, and/or He. In some embodiments, the etch process is chosen to selectively etch first sacrificial layer 420 without substantially etching the first gate metal layer 414. Thus, the first sacrificial layer 420 is recessed with a self-alignment nature, which relaxes process constrains. The recessed first sacrificial layer 420, referred to as 420' thereafter, has a height h. After recessing the first sacrificial layer 420, a portion of the first gate metal layer 414 and a portion of the gate dielectric layer 412 are uncovered by the first sacrificial layer 420', as shown in FIG. 6A.

Figure 7A:
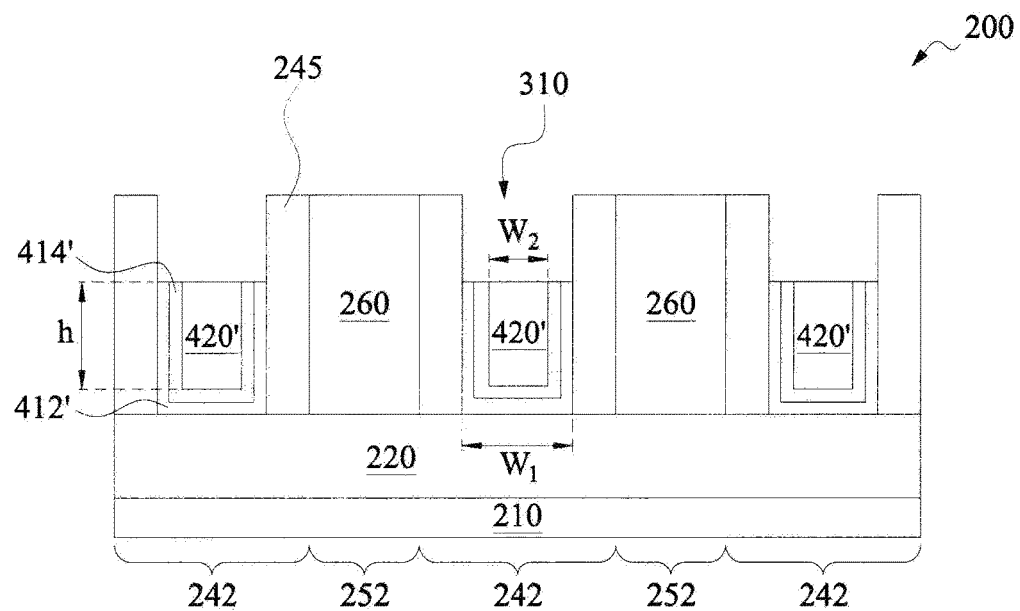
Figure 7B:
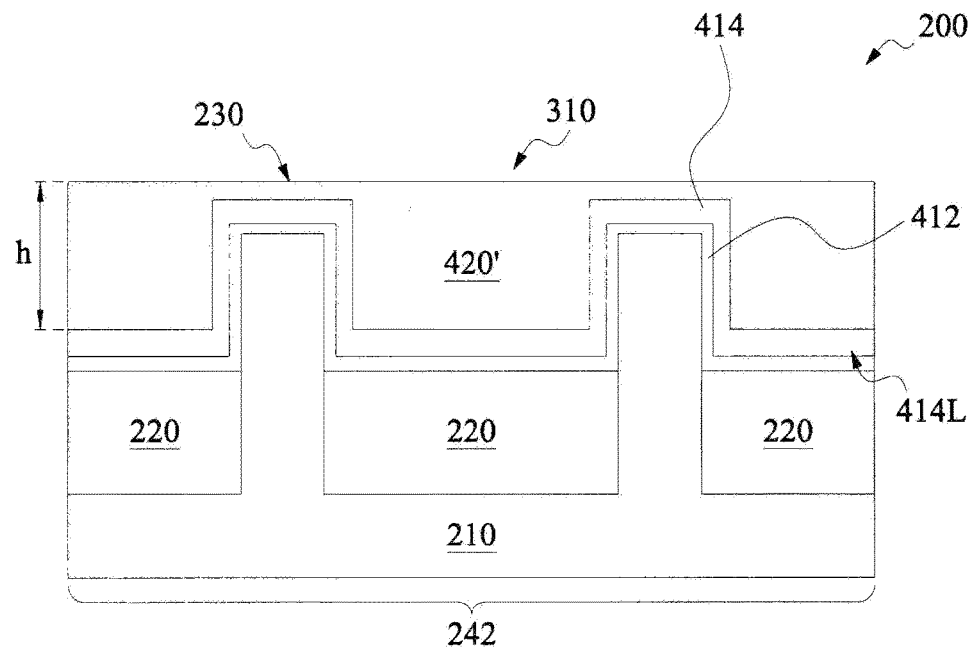

Referring to FIGS. 1, 7A and 7B, method 100 proceeds to step 112 by recessing the uncovered first gate metal layer 414 and the uncovered gate dielectric layer 412 in trenches 310, referred to as 414' and 412', respectively. The etch process may include a wet etch, a dry etch, and/or a combination thereof. As an example, a wet etching solution may include $HNO_3$, $NH_4OH$, KOH, HF, HCl, NaOH, $H_3PO_4$, and/or other suitable wet etching solutions, and/or combinations thereof. Alternatively, a dry etching process may implement chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. In some embodiments, the etch process is chosen to selectively etch the first gate metal layer 414 and the gate dielectric layer 412 without substantially etching the first sacrificial layer 420', the sidewall spacers 245 and the ILD layer 260. Thus, the first gate metal layer 414 and the gate dielectric layer 412 are recessed with a self-alignment nature, which relaxes process constrains. The etching process is controlled such that top surfaces of the recessed first gate metal layer 414 and the gate dielectric layer 412 are substantially coplanar with a top surface of the first sacrificial layer 420'.

Figure 8A:
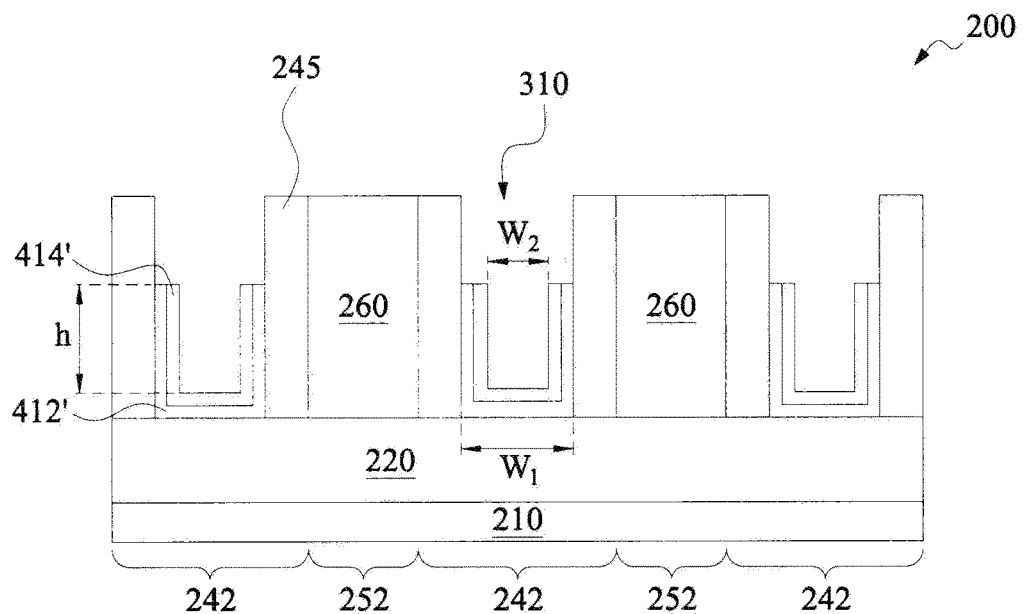
Figure 8B:
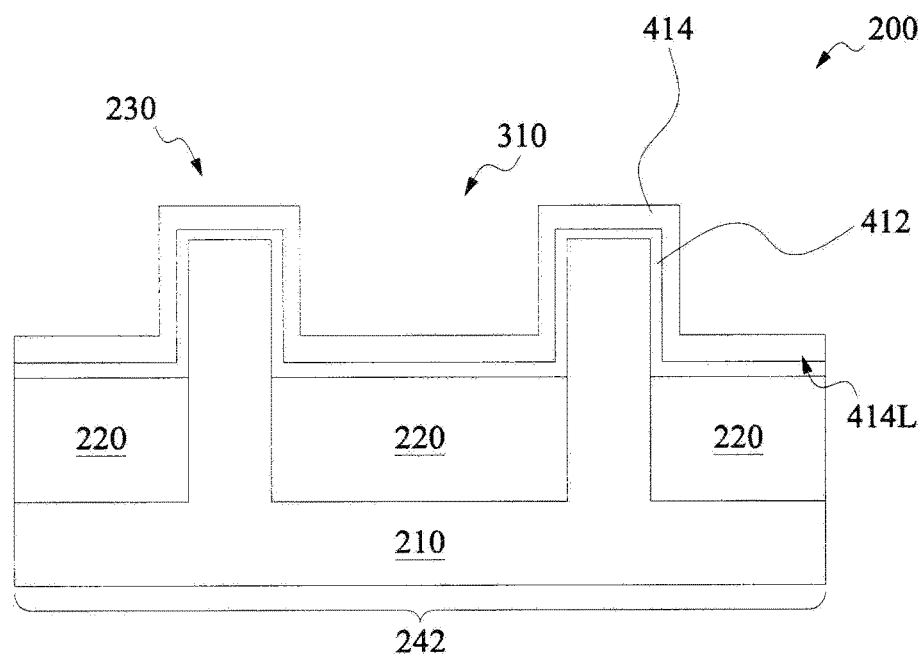

Referring to FIGS. 1, 8A and 8B, method 100 proceeds to step 114 by removing the first sacrificial layer 420'. The etch process may include a wet etch, a dry etch, and/or a combination thereof. For example, a wet etching solution may include $NH_4OH$, KOH, HF, TMAH, and/or other suitable wet etching solutions, and/or combinations thereof. In some embodiments, the etch process is chosen to selectively etch first sacrificial layer 420 without substantially etching the first gate metal layer 414', the sidewall spacers 245 and the ILD layer 260. Thus, the first sacrificial layer 420 is removed with a self-alignment nature, which relaxes process constrains.

Figure 9A:
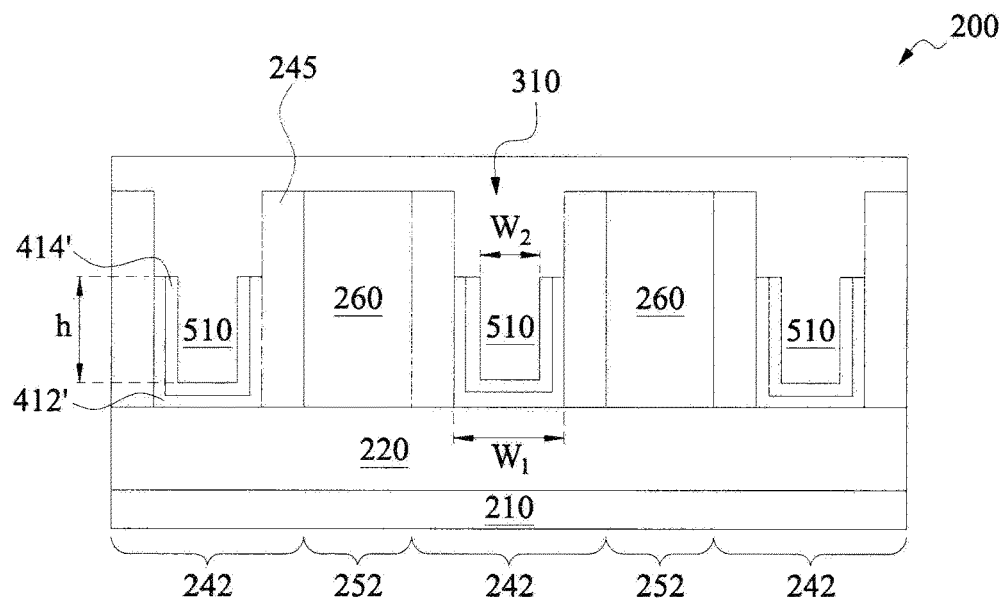
Figure 9B:
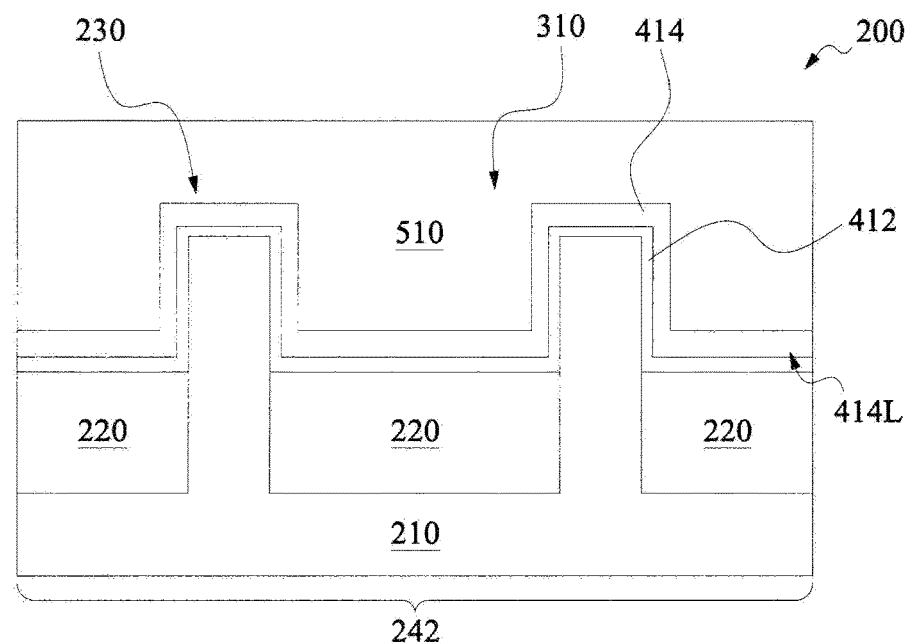

Referring to FIGS. 1, 9A and 9B, method 100 proceeds to step 116 by depositing a second sacrificial layer 510 over the first gate metal layer 414', 414 and the gate dielectric layer 412'. The second sacrificial layer 510 is formed similarly in many respects to the first sacrificial layer 420 discussed above association with FIGS. 5A and 5B, including the materials discussed therein. In some embodiments, the second sacrificial layer 510 fully fills in the gate trenches 310.

Figure 10A:
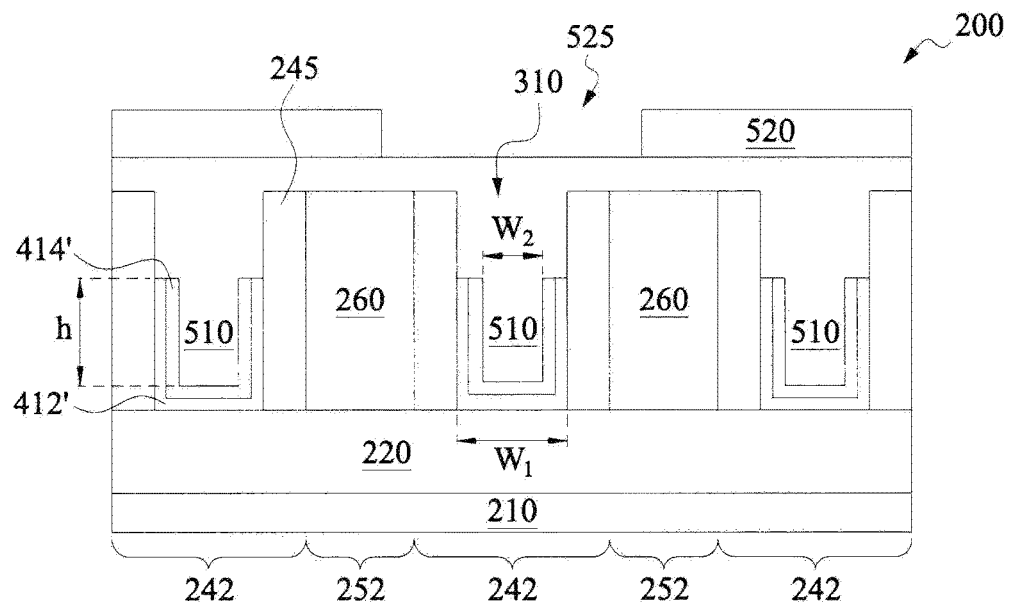
Figure 10B:
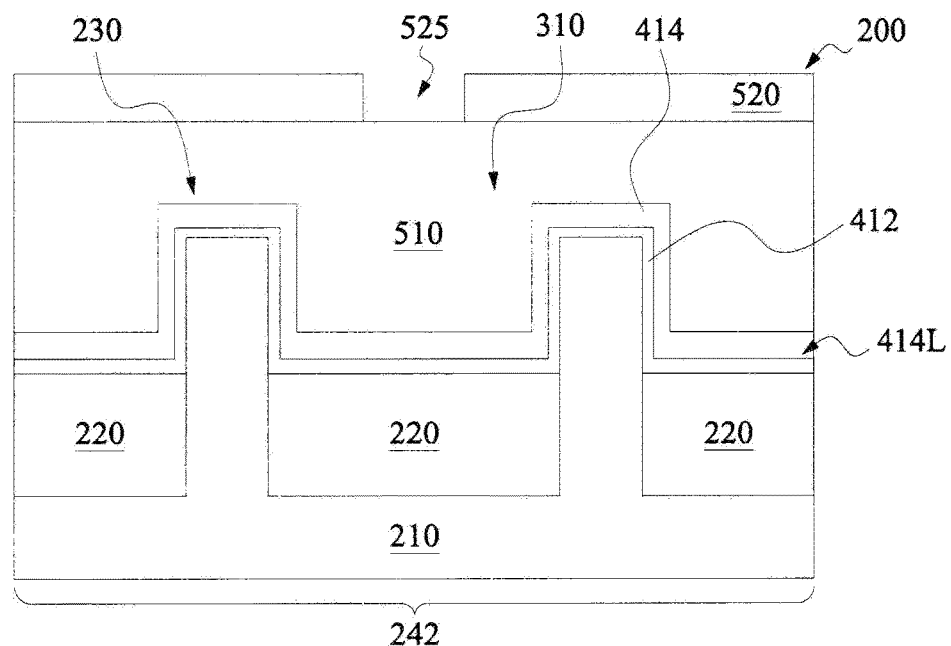

Referring to FIGS. 1, 10A and 10B, method 100 proceeds to step 118 by forming a first patterned hard mask (HM) 520 over the second sacrificial layer 510. The first patterned HM 520 has an opening 525 defining a line-cut. A portion of the first gate metal layer 414 and the gate dielectric layer 412 are aligned within the opening 525. In some embodiments, the opening 525 has a greater width along a direction of line A-A such that adjacent sidewall spacers 245 and the ILD layer 260 are exposed in the opening 525 to obtain advantages, such as relaxing lithography process resolution constrains, especially when the device 200 scales down such that spaces between two adjacent fin features 230 become smaller and smaller.

In some embodiments, the first patterned HM 520 may include a patterned photoresist layer and formed by a by a lithography process. An exemplary lithography process may include forming a photoresist layer, exposing the photoresist layer by a lithography exposure process, performing a post-exposure bake process, and developing the photoresist layer to form the patterned resist layer. Alternatively, the first patterned HM 520 may be formed by depositing a HM layer, forming a patterned photoresist layer over the HM layer by a lithography process and etching the HM material layer through the patterned photoresist layer to form the first patterned HM 520. As an example, the HM material layer may include silicon nitride.

Figure 11A:
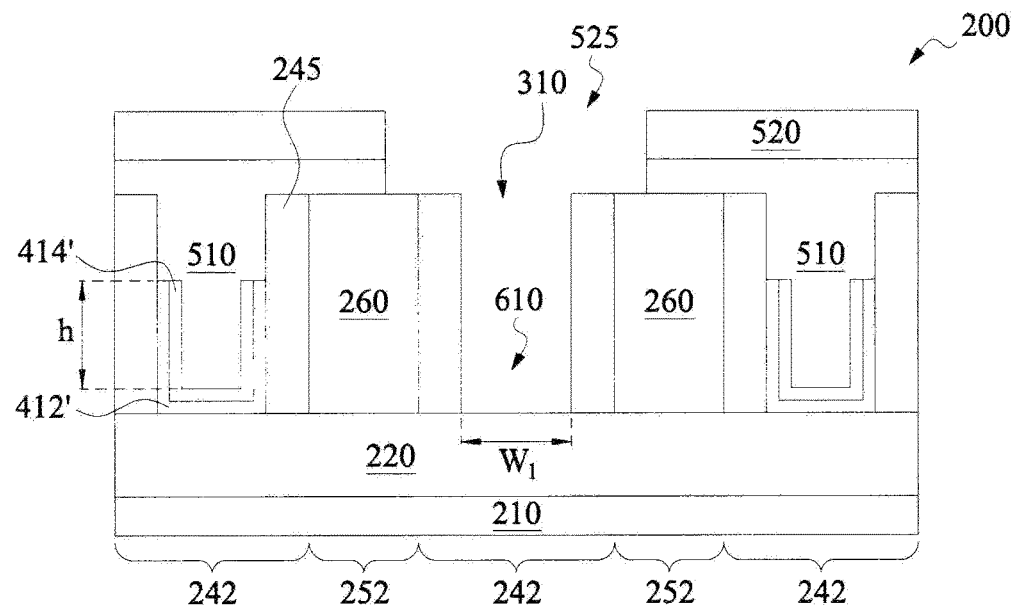
Figure 11B:
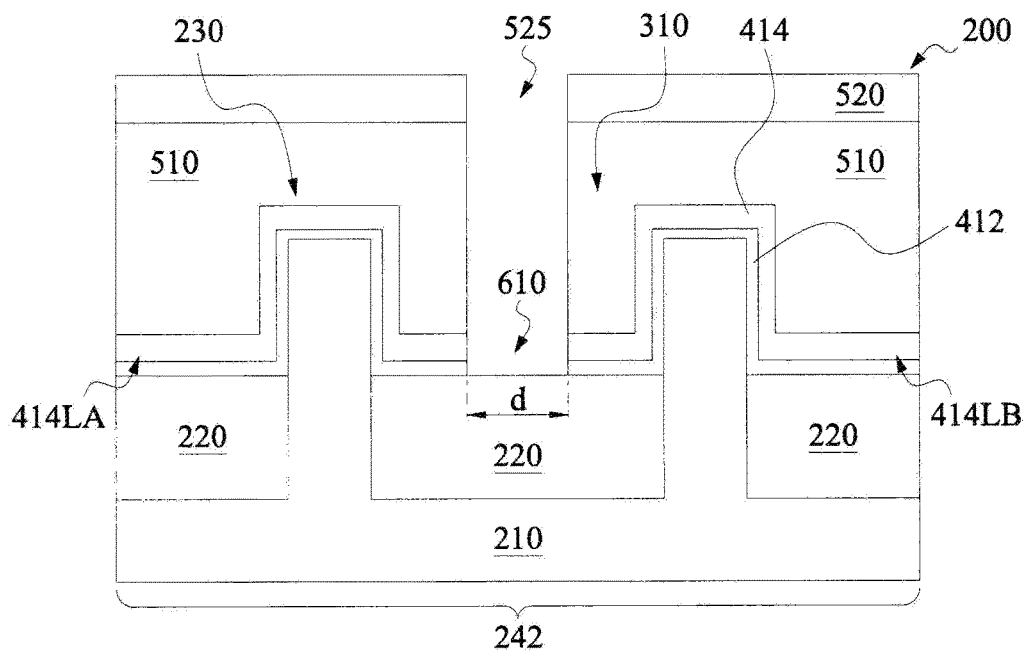

Referring to FIGS. 1, 11A and 11B, method 100 proceeds to step 120 by applying a first line-cutting by etching the second sacrificial layer 510, the first gate metal layer 414' and the gate dielectric layer 412' through the opening 525 to form a first line-cut 610. The first line-cut 610 carries the first width $w_1$ along direction of line A-A. In the present embodiment, the first line-cut 610 extends to the isolation features 220 and divides the first MG line 414L into a first sub-MG line 414LA and a second sub-MG line 414LB and they are separated away from each other by a width d along the direction of line B-B.

The etch process may include a wet etch, a dry etch, and/or a combination thereof. A dry etching process may implement fluorine-containing gas (e.g., $CF_4$, $SF_6$, $CH_2F_2$, $CHF_3$, and/or $C_2F_6$), and/or other suitable gases thereof. A wet etching solution may include $HNO_3$, $NH_4OH$, KOH, HF, HCl, NaOH, $H_3PO_4$, and/or other suitable wet etching solutions, and/or combinations thereof. In some embodiment, a dry etch process is performed first to etch the second sacrificial layer 510 and a wet etch is then performed to etch the first. MG line 414L.

Figure 11C:
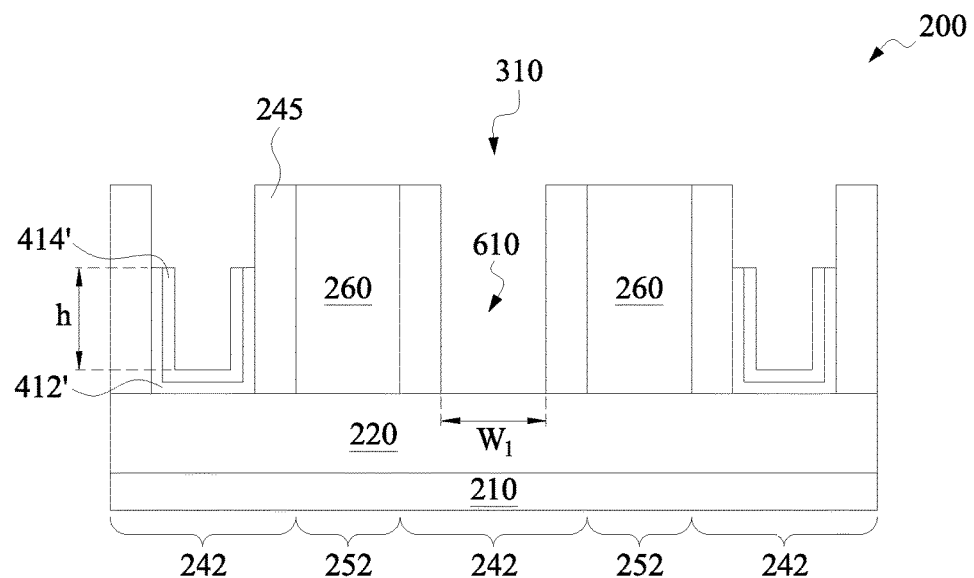
Figure 11D:
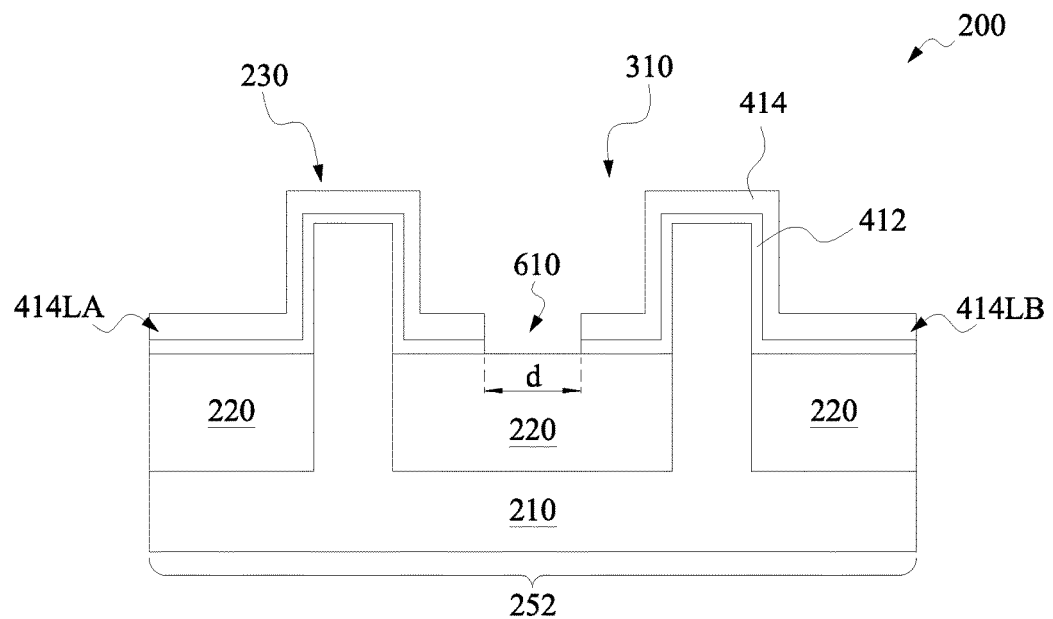

In some embodiments, the etch process is chosen to selectively etch etching the second sacrificial layer 510, the first gate metal layer 414' and the gate dielectric layer 412' without substantially etching the sidewall spacers 245 and the ILD layer 260. As shown, for circumstances where the portions of the sidewall spacers 245 and the ILD layer 260 are exposed in the opening 525 (as shown in FIGS. 10A and 10B), the exposed portions of the sidewall spacers 245 and the ILD layer 260 together serves as a sub-etch-mask. The first line-cut 610 carries the first width $w_1$ along direction of line A-A. After forming the first line-cut 610, the patterned HM 520 and the second sacrificial layer 510 are removed by an etch process, as shown in FIGS. 11C and 11D.

Typically, it is a challenge to etch a MG line within a trench (e.g. the gate trenches 310) especially when the device 200 scales down such that the first width $w_1$ of the gate trenches 310 become smaller and smaller. To address this issue, the present application allows a MG line to be formed by a combination of a first gate metal layer 414 (See FIG. 4B) and a second gate metal layer 620 (See FIG. 12B) which allows subsequent cutting of the MG line to occur in two separate etching process (See FIGS. 11B and 19B), which relaxes metal etching process constrains. This two-step process allows for thinner metal layers to be initially formed and thereby relaxes the etching constraints on cutting the respective metal layers. Moreover, it should be noted that the present disclosure is not intended to be limited to two metal layers that form a MG line. Instead, it is contemplated that two or more metal layers and two or more respective etching processes may be utilized to meet a specific design requirement.

Figure 12A:
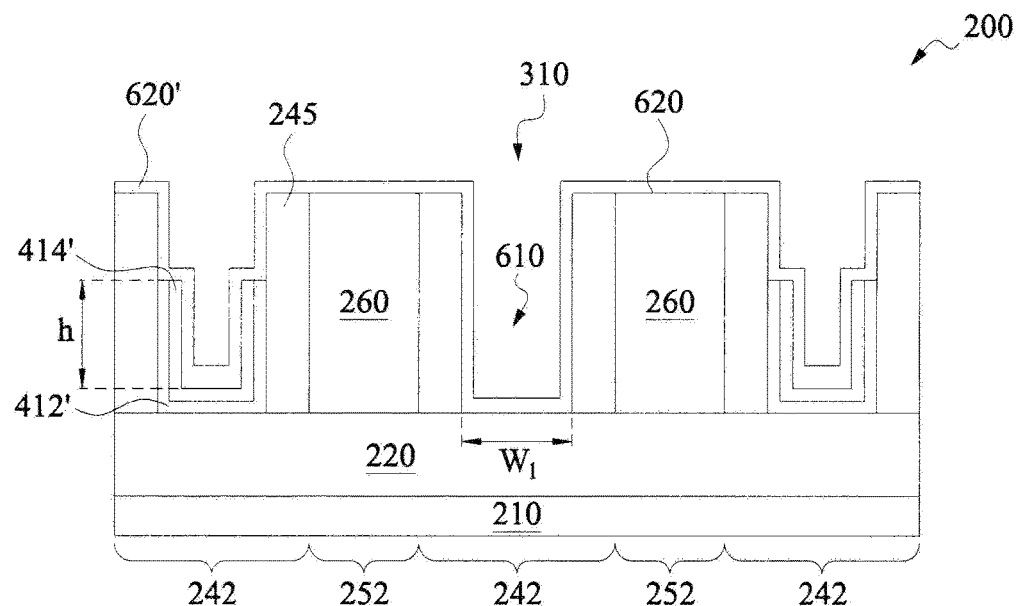
Figure 12B:
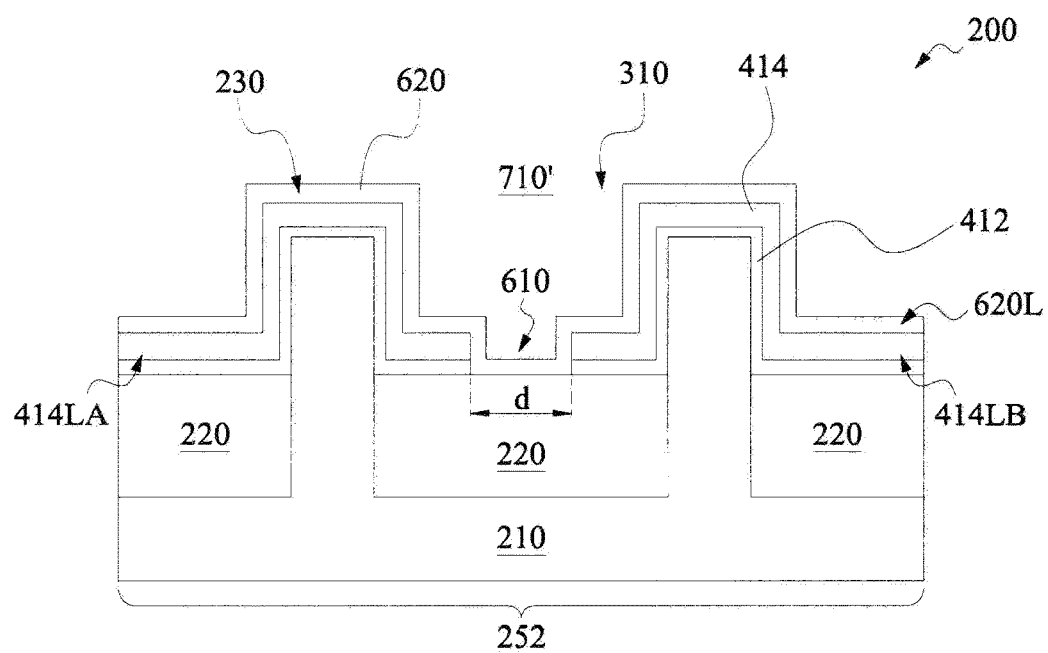

Referring to FIGS. 1, 12A and 12B, method 100 proceeds to step 122 by depositing a second gate metal layer 620 over the first gate metal layers 414LA and 414LB, including filling in the first line-cut 610. In the present embodiment, the second gate metal layer 620 is a second portion of the final MG layer. As a result, along the direction of line B-B, the second gate metal layer 620 continually extends from one fin feature 230 to another fin feature 230 to form a second MG line 620L. By way of example, the second gate metal layer 620 may include Ti, TiAlN, TaC, TaCN, TaSiN, TiN, TaN, other suitable metal materials or a combination thereof. In various embodiments, the second gate metal layer 620 may be formed by ALD, PVD, CVD, e-beam evaporation, or other suitable process. Further, the second gate metal layer 620 may be formed separately for N-FET and P-FET transistors which may use different metal layers.

Figure 13A:
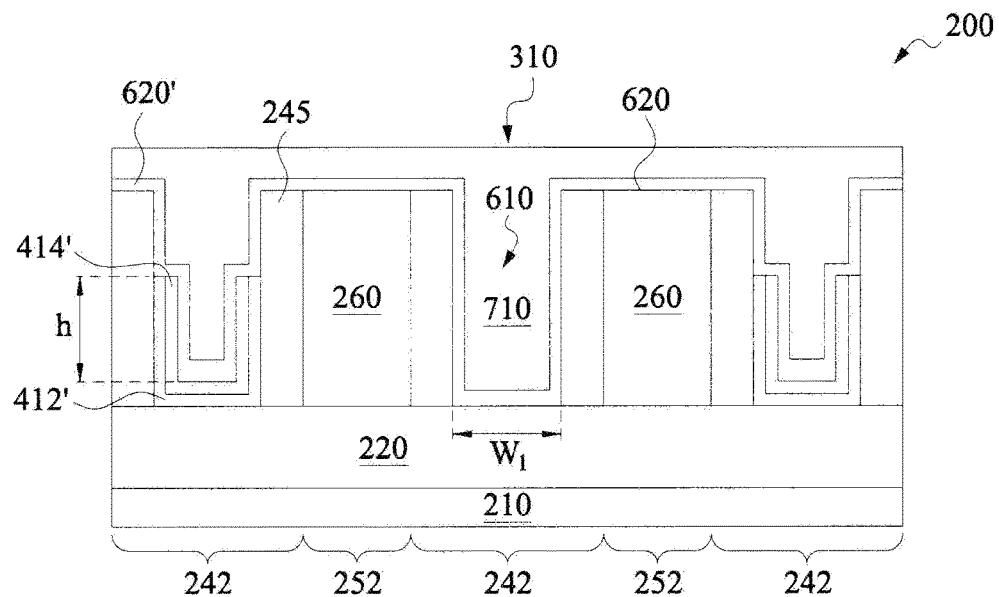
Figure 13B:
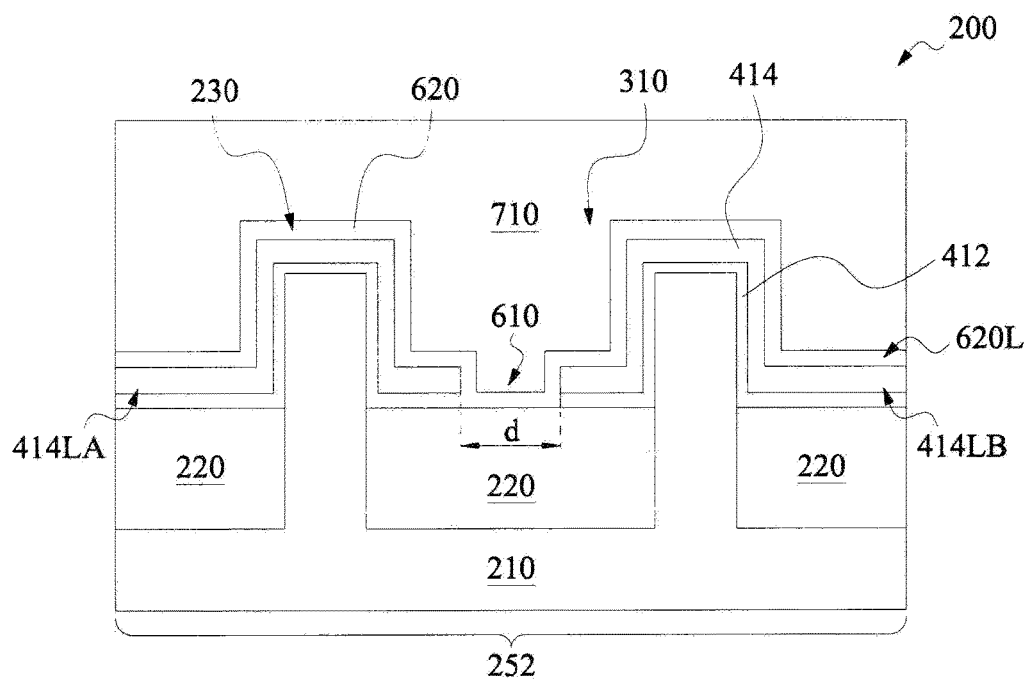

Referring to FIGS. 1, 13A and 13B, method 100 proceeds to step 124 by depositing a third sacrificial layer 710 over the second gate metal layer 620. The third sacrificial layer 710 is formed similarly in many respects to the first sacrificial layer 420 discussed above association with FIGS. 5A and 5B, including the materials discussed therein. In some embodiment, the third sacrificial layer 710 fully fills in the gate trenches 310.

Figure 14A:
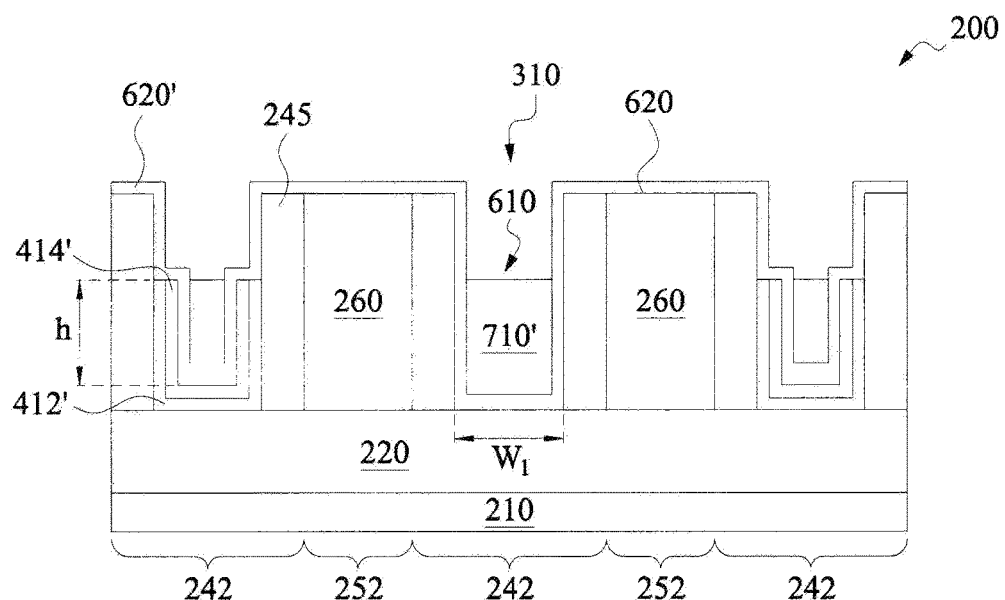
Figure 14B:
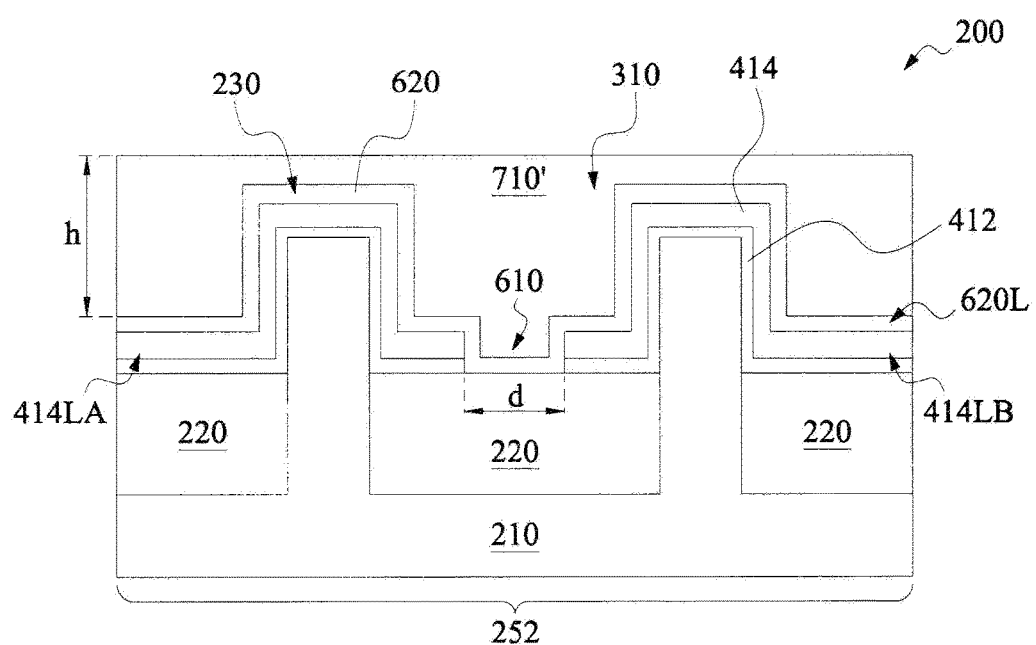

Referring to FIGS. 1, 14A and 14B, method 100 proceeds to step 126 by recessing the third sacrificial layer 710. The third sacrificial layer 710 is recessed similarly in many respects to the recessing process discussed above association with FIGS. 6A and 6B. The recessed third sacrificial layer 710, referred to as 710' thereafter, has the same height as the first gate metal 414', namely height h. After recessing the third sacrificial layer 710, a portion of the second gate metal layer 620 is uncovered by the third sacrificial layer 710', as shown in FIG. 14A.

Figure 15A:
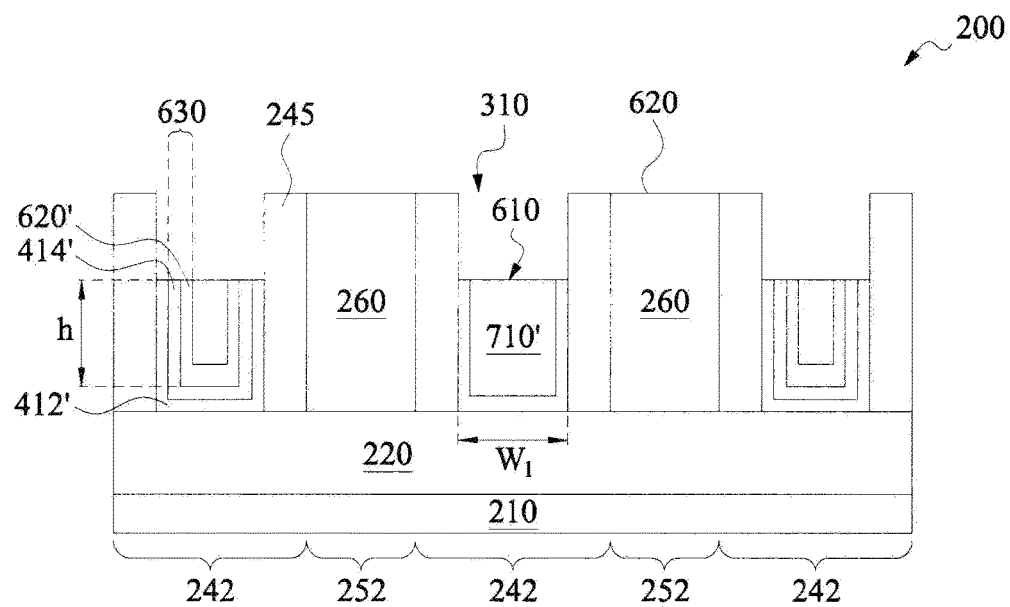
Figure 15B:
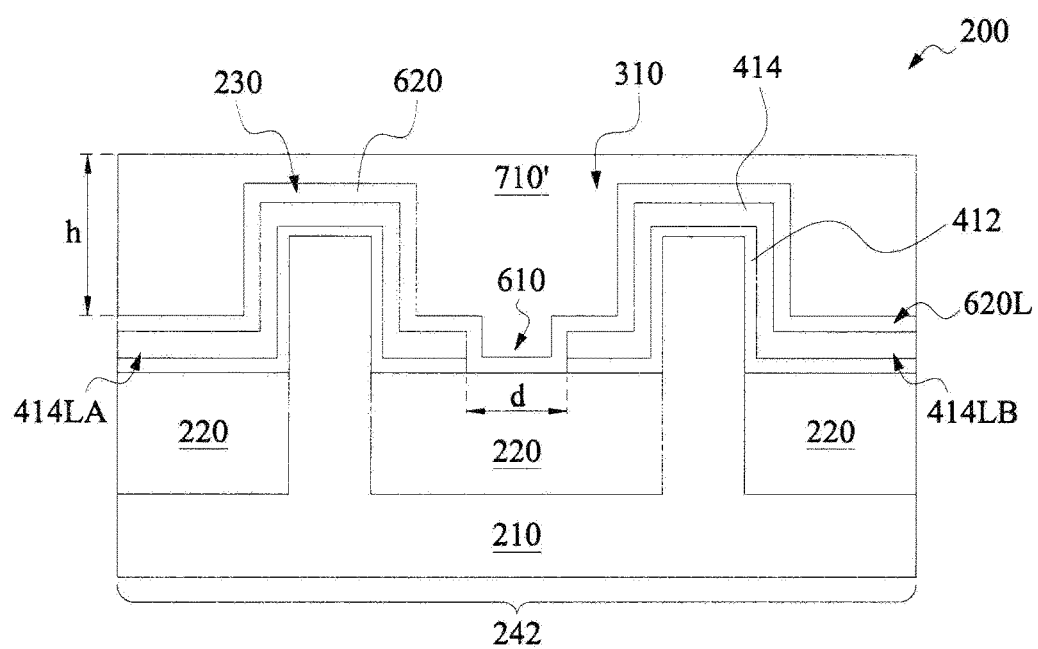

Referring to FIGS. 1, 15A and 15B, method 100 proceeds to step 128 by recessing the uncovered second gate metal layer 620 in gate trenches 310. The second gate metal layer 620 is recessed similarly in many respects to the recessing process discussed above association with FIGS. 7A and 7B. In some embodiments, the etch process is chosen to selectively etch the second gate metal layer 620 without substantially etching the third sacrificial layer 710', the sidewall spacers 245 and the ILD layer 260. Thus the second gate metal layer 620 is recessed with a self-alignment nature, which relaxes process constrains. The etching process is controlled such that a top surface of the recessed second gate metal 620 is substantially coplanar with a top surface of the third sacrificial layer 710'.

Figure 16A:
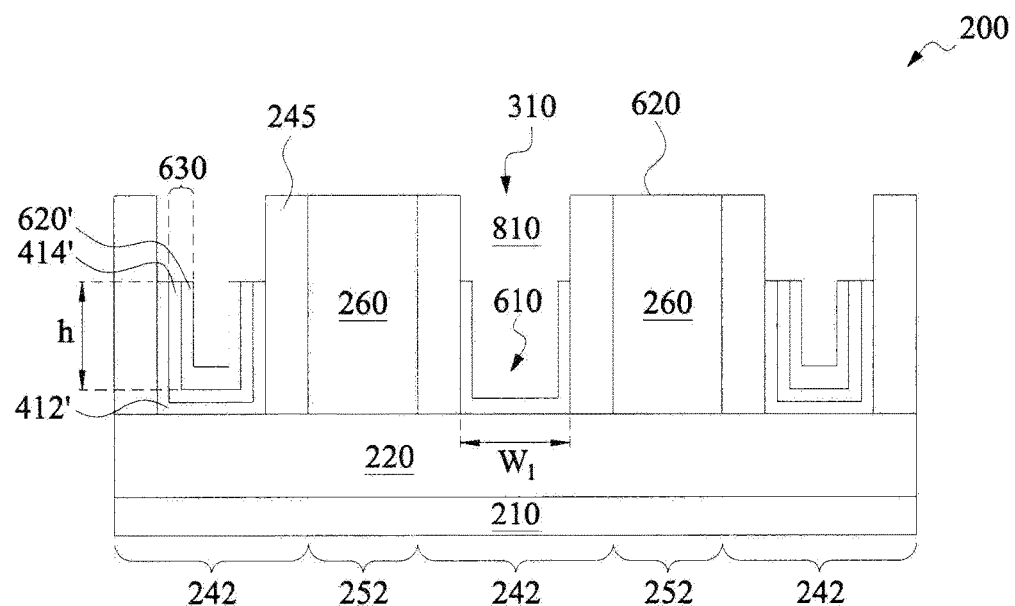
Figure 16B:
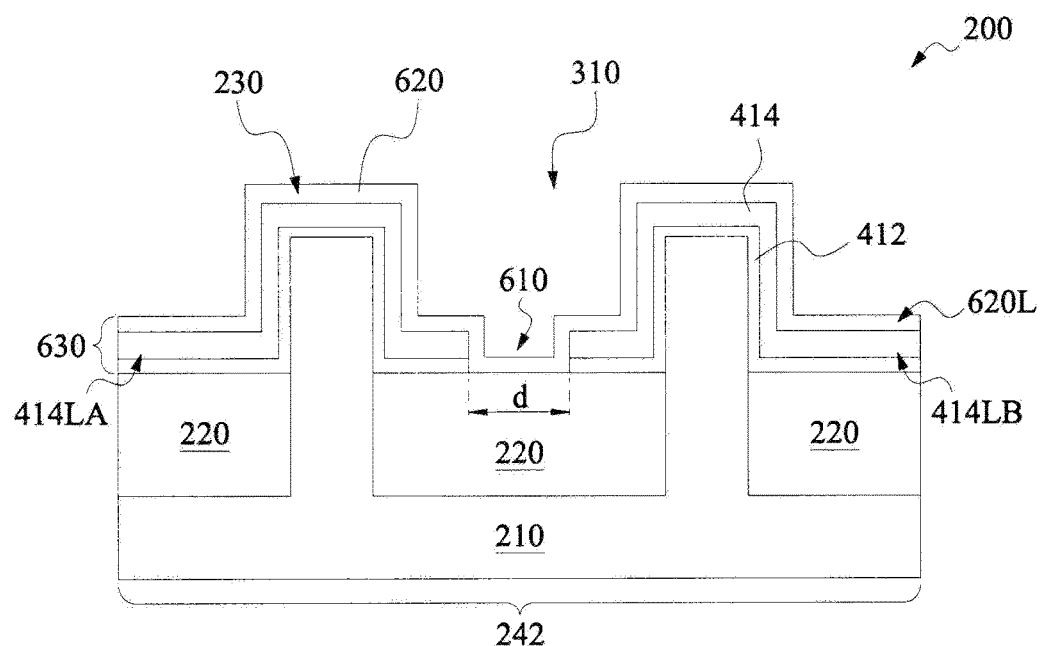

Referring to FIGS. 1, 16A and 16B, method 100 proceeds to step 130 by removing the third sacrificial layer 710'. The third sacrificial layer 710' is removed similarly in many respects to the etch process discussed above association with FIGS. 8A and 8B. In some embodiments, the etch process is chosen to selectively etch third sacrificial layer 710' without substantially etching the second gate metal layers 620 and 620', the sidewall spacers 245 and the ILD layer 260. Thus, the third sacrificial layer 710' is removed with a self-alignment nature, which relaxes process constrains. In the present embodiment, the first and second gate metal layers, 414 and 620, form the final. MG layer 630.

Figure 17A:
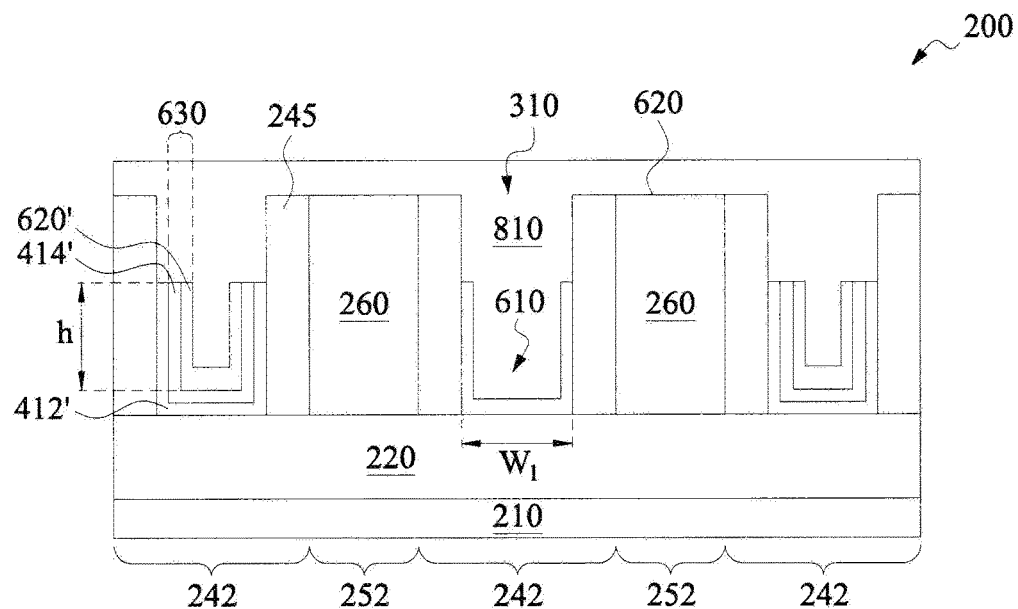
Figure 17B:
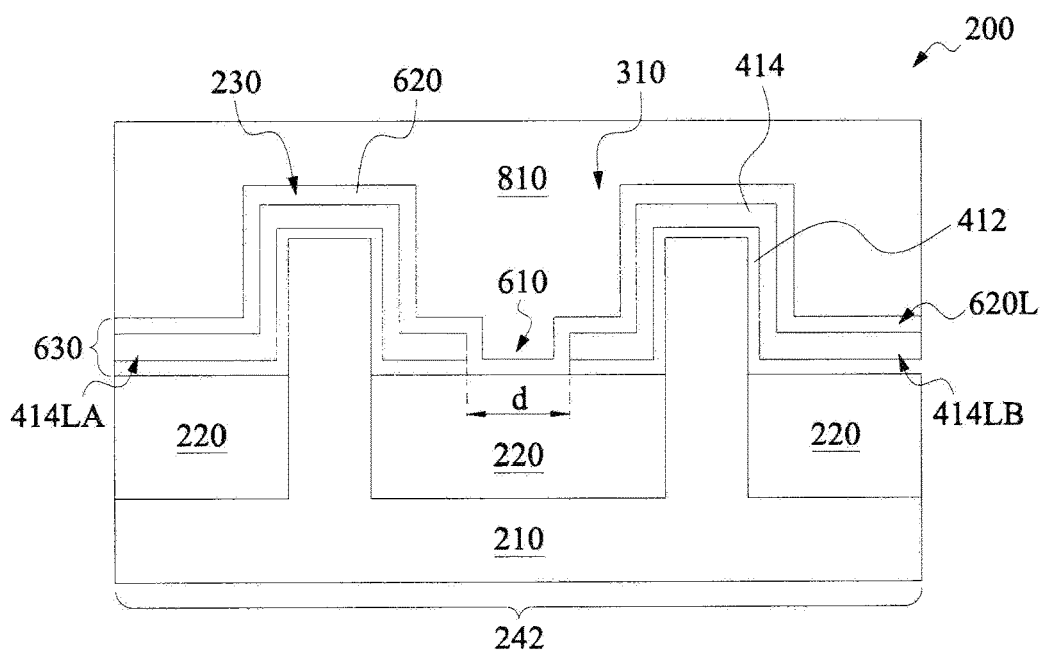

Referring to FIGS. 1, 17A and 17B, method 100 proceeds to step 132 by depositing a first dielectric layer 810 over the substrate 210, including filling in the gate trenches 310 and including over the second gate metal layer 620'. The first dielectric layer 810 may be deposited by CVD, ALD, spin-on coating, or other suitable techniques. The first dielectric layer 810 may include silicon oxide, silicon nitride, oxynitride, a dielectric material having a dielectric constant (k) lower than thermal silicon oxide (therefore referred to as low-k dielectric material layer), and/or other suitable dielectric material layer. In some embodiments, the first dielectric layer 810 includes a material which is different from the sidewall spacers 245 and the ILD 260 to achieve etching selectivity subsequent etches.

Figure 18A:
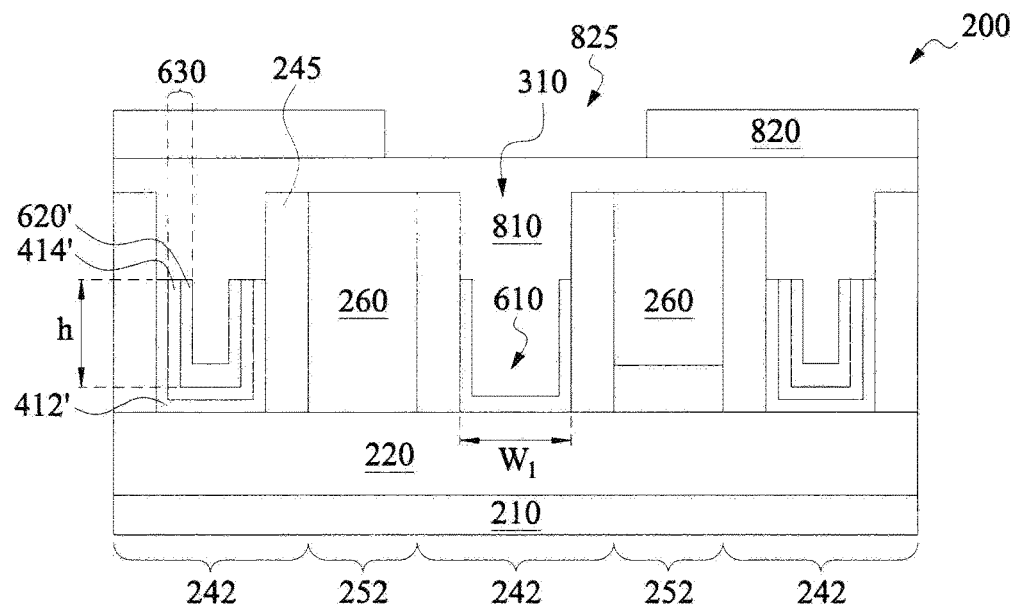
Figure 18B:
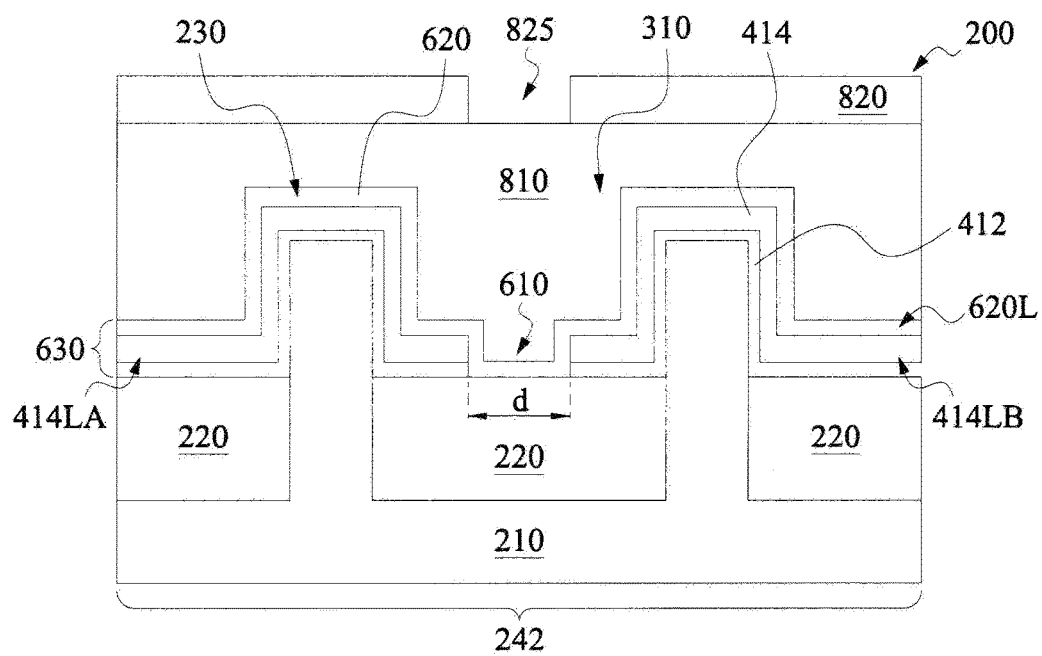

Referring to FIGS. 1, 18A and 18B, method 100 proceeds to step 134 by forming a second patterned HM 820 over the first dielectric layer 810. The second patterned HM 820 has an opening 825. In some embodiments, the opening 825 aligns with the first line-cut 610 along direction of line B-B. In some embodiments, the opening 825 has a larger width along the direction of line A-A such that adjacent sidewall spacers 245 and the ILD layer 260 are included within the opening 825 to obtain advantages, such as relaxing lithography process resolution constrains, especially when the device 200 scales down such that spaces between two adjacent fin features 230 become smaller and smaller. In some embodiment, the second pattered HM 820 is formed similarly in many respects to the first patterned HM 520 discussed above association with FIGS. 10A and 10B, including the materials discussed therein.

Figure 19A:
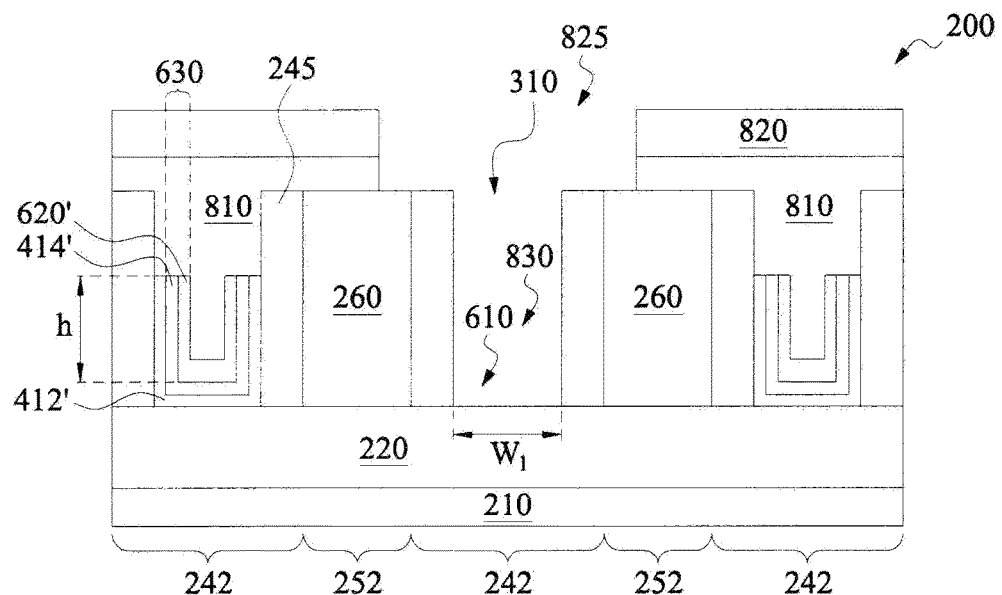
Figure 19B:
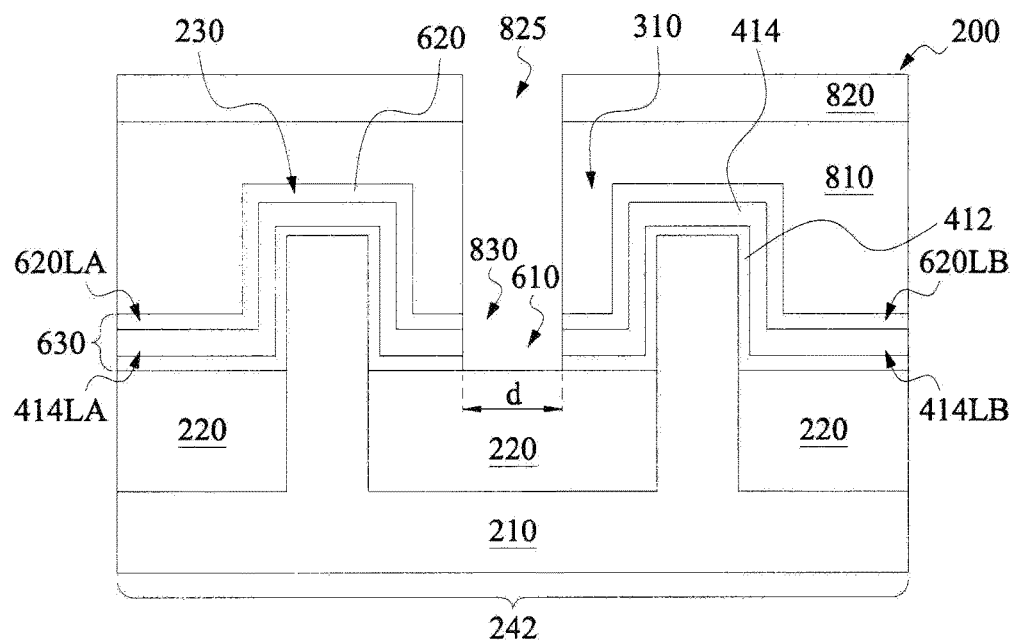

Referring to FIGS. 1, 19A and 19B, method 100 proceeds to step 136 by applying a second line-cutting to etch the first dielectric layer 810 and the second gate metal layer 620' through the opening 825 to form a second line-cut 830, which aligns with the first line-cut 610. As a result, the second MG line 620L is cut into two second sub-MG lines, 620LA and 620LB and they are separated away from each other by the width d along the direction of line B-B. The second line-cut 830 is formed similarly in many respects to the first line-cut 610 discussed above association with FIGS. 11A and 11B.

Figure 19C:
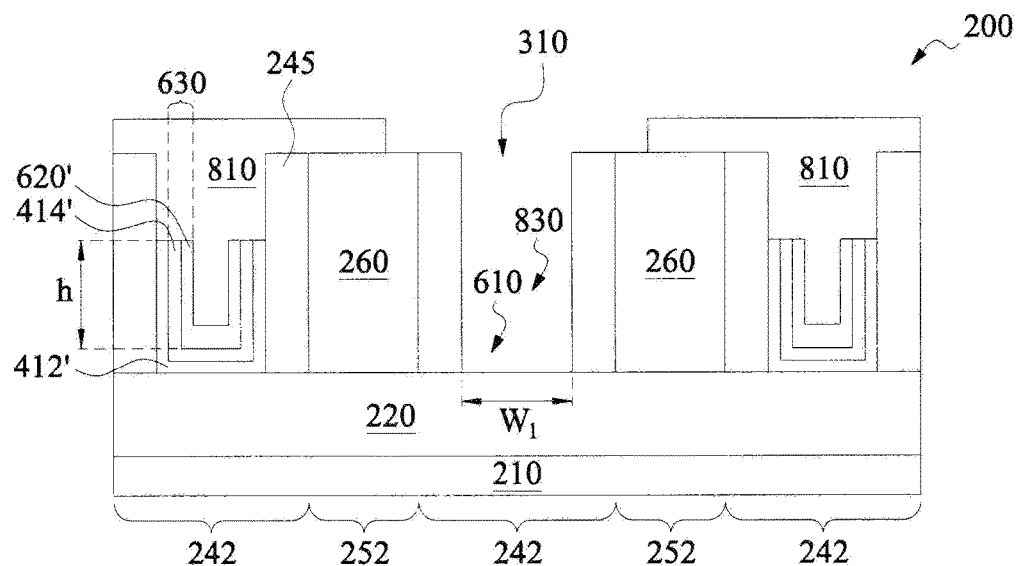
Figure 19D:
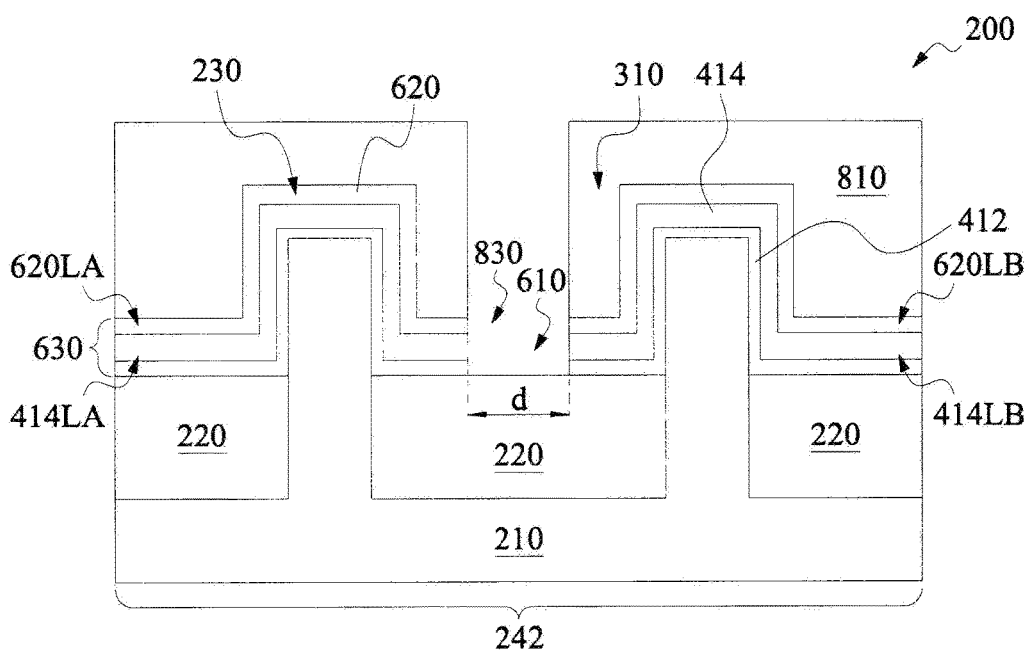

In some embodiments, the etch process is chosen to selectively etch etching the dielectric layer 810 and the second gate metal layer 620' without substantially etching the sidewall spacers 245 and the ILD layer 260. As shown, for circumstances where the portions of the sidewall spacers 245 and the ILD layer 260 are exposed in the opening 825 during the etching process, the exposed portions of the sidewall spacers 245 and the ILD layer 260 together serves as a sub-etch-mask. In some embodiments, a selective dry etch is performed first to etch the dielectric layer 810 and a selective wet etch is followed to etch the second gate metal layer 620. After etching the second gate metal layer 620, the second patterned HM 820 is removed by an etch process, as shown in FIGS. 19C and 19D.

As has been mentioned previously, the present application allows final MG line to be formed by a combination of a first gate metal layer 414 (See FIG. 4B) and a second gate metal layer 620 (See FIG. 12B) which allows subsequent cutting of the MG line to occur in two separate etching process (See FIGS. 11B and 19B). Thus, unlike conventional line cutting processes in which all metal layers forming the final MG line are cut during the same etching process, the disclosed process allows for the individual metal layers of the final MG line to be individually cut at different processing points in time which relaxes the etching constraints on cutting the respective metal layers.

Figure 20A:
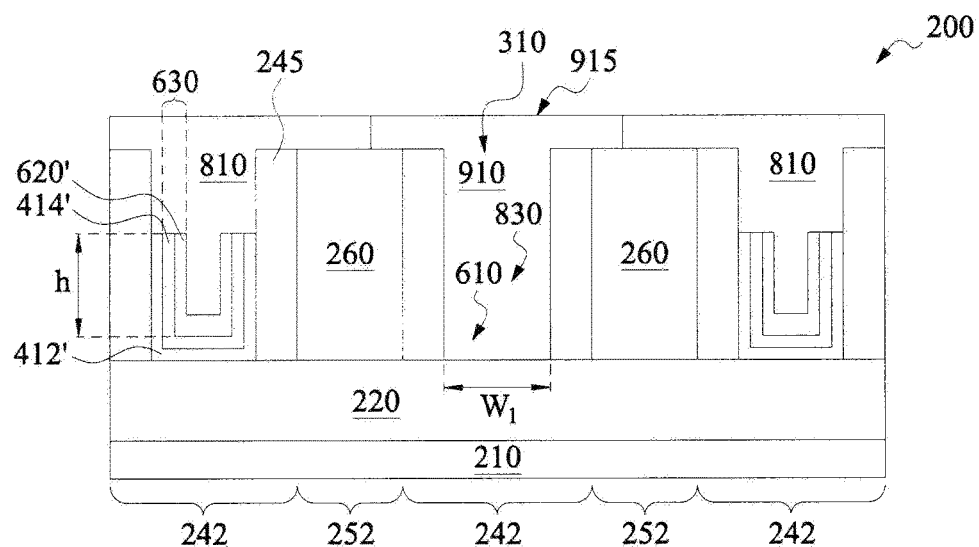
Figure 20B:
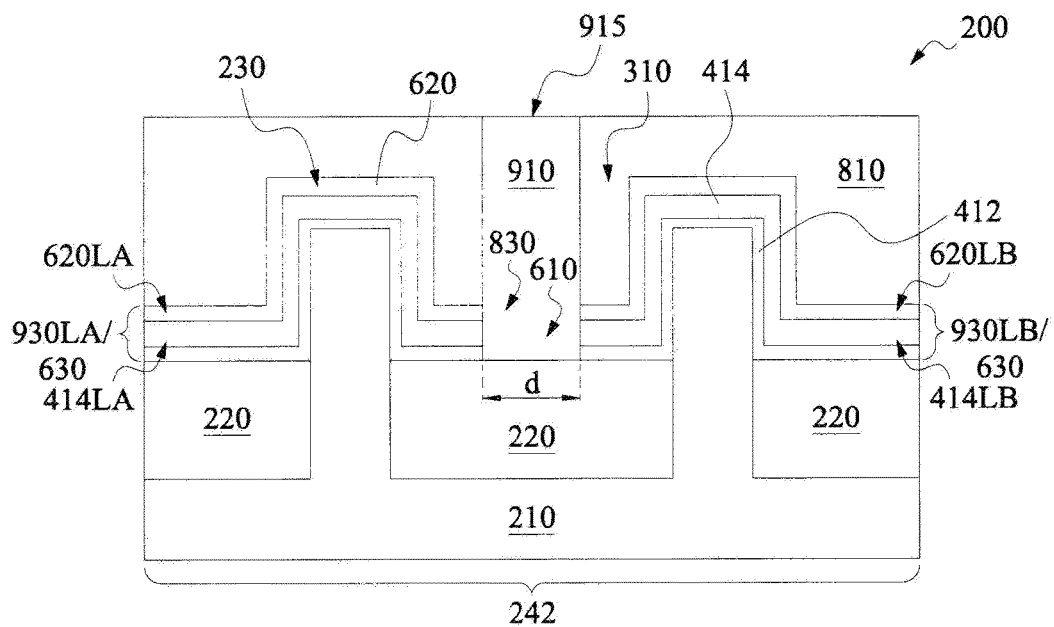

Referring to FIGS. 1 and 20A-20B, method 100 proceeds to step 138 by filling in the second line-cut 830 and the first line-cut 610 with a second dielectric layer 910 to form an isolation region 915 between the first and second sub-MG lines, 414LA and 414LB, and the third and fourth sub-MG lines, 620LA and 620LB. The second dielectric layer 910 is formed similarly in many respects to the first dielectric layer 810 discussed above association with FIGS. 19A and 19B, including the materials discussed therein. A CMP may be performed to polish back the second dielectric layer 910 to provide a substantially planar top surface of the second dielectric layer 910 with respect to the first dielectric layer 810. The isolation region 915 extends over the adjacent sidewall spacers 245 and the portion of the ILD layer 260, which are exposed within the opening 825 in FIG. 18A.

As a result, the third sub-MG line 620LA is disposed over and in physical contact with the first sub-MG line 414LA to form a first final sub-MG line 930LA. Similarly, the fourth sub-MG line 620LB is disposed over and in physical contact with the second sub-MG line 414LB to form a second final sub-MG line 930LB. The first and second final sub-MG lines, 930LA and 930LB, are separated by the isolation region 915.

Additional steps can be provided before, during, and after method 100, and some of the steps described can be replaced, eliminated, or moved around for additional embodiments of method 100. Other alternatives or embodiments may present without departure from the spirit and scope of the present disclosure.

The semiconductor device 200 may undergo further CMOS or MOS technology processing to form various features and regions known in the art. For example, subsequent processing may form various contacts/vias/lines and multilayers interconnect features (e.g., metal layers and interlayer dielectrics) over the substrate 210, configured to connect the various features or structures of the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, it can be seen that the present disclosure provides methods of cutting a metal gate (MG) line after a HK/MG replaces a dummy gate stack. The method employs forming/cutting a first portion of the MG line and then forming/cutting a second portion of the MG line. The method also employs recessing gate metal layer by using a recessed sacrificial layer as a portion of etch mask. The method demonstrates a feasible and flexible process for forming and cutting MG line.

The present disclosure provides many different embodiments of fabricating a semiconductor device that provide one or more improvements over existing approaches. In one embodiment, a method for fabricating a semiconductor device includes forming a first fin and a second fin on a substrate. The first fin has a first source/drain region and a first gate region and the second fin has a second source/drain region and a second gate region. The method also includes forming a metal-gate line over the first and second gate regions. The metal-gate line extends from the first fin to the second fin. The method also includes applying a line-cut to separate the metal-gate line into a first sub-metal gate line and a second sub-metal gate line and forming an isolation region within the line cut.

The present disclosure provides many different embodiments of fabricating a semiconductor device that provide one or more improvements over existing approaches. In one embodiment, a method for fabricating a semiconductor device includes forming a first fin and a second fin on a substrate, the first fin having a first gate region and the second fin having a second gate region and forming a first metal-gate line over the first and second gate regions. The first metal-gate line extends from the first fin to the second fin. The method also includes applying a first line-cut to separate the first metal-gate line into a first sub-metal gate line and a second sub-metal gate line and forming a second metal-gate line over the first sub-metal gate line and the second sub-metal gate line. The second metal-gate line extends from the first fin to the second fin. The method also includes applying a second line-cut to separate the second metal-gate line into a third sub-metal gate line and a fourth sub-metal gate line such that a gap is formed between the third sub-metal gate line and the fourth sub-metal gate line and forming an isolation region within the gap.

In another embodiment, a method includes forming a first fin and a second fin on a substrate. The first fin has a first a first gate region and the second fin has a second gate region. The method also includes forming a first metal-gate line over the first and second gate regions. The first metal-gate line extends from the first fin to the second fin. The method also includes forming a first sacrificial layer over the first metal-gate line and forming a first patterned hard mask over the first sacrificial layer. The first patterned hard mask defines a first opening. The method also includes etching the first sacrificial layer through the first opening and etching the first metal-gate line through the first opening to form a first cut. The first metal-gate line is separated into a first sub-metal gate line and a second sub-metal gate line by the first cut. The method also includes forming a second metal-gate line over the first sub-metal gate line, the second sub-metal gate line and the first cut. The second metal-gate line extends from the first fin to the second fin. The method also includes forming a dielectric layer over the second metal gate line and forming a second patterned hard mask over the dielectric layer. The second patterned hard mask defines a second opening. The method also includes etching the dielectric layer through the second opening and etching the second metal-gate line through the second opening to form a second cut. The second metal-gate line is separated into a third sub-metal gate line and a fourth sub-metal gate line by the second cut.

In yet another embodiment, a method includes forming a plurality of fins on a substrate and each of the fins has a gate region. The method also includes forming dummy gate stack in each gate region, forming sidewall spacers along sidewalls of each dummy gate stack, forming an interlayer dielectric (ILD) layer over the substrate, including beside the dummy gate stacks, removing the dummy gate stacks to expose portions of the fins and forming a first metal layer over the exposed portions of the fins. The first metal layer forms a first metal-gate line. The method also includes forming a first line-cut to cut the first metal-gate line into first sub-metal-gate lines and forming a second metal layer over first sub-metal-gate lines, including over the first line cut. The second metal layer forms a second metal-gate line. The method also includes forming a second line-cut to cut the second metal-gate line into second sub-metal-gate lines and forming an isolation region within the first and second line cuts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein, Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first fin and a second fin on a substrate, the first fin having a first gate region and the second fin having a second gate region, the first fin being parallel to and spaced apart from the second fin by an isolation feature;
    forming a first metal-gate line traversing the first and second fins over the first and second gate regions, wherein the first metal-gate line extends lengthwise from the first fin to the second fin, wherein the forming of the first metal-gate line over the first and second gate regions includes forming a first metal layer over the first and second gate regions;
    forming a first sacrificial layer over the first metal layer;
    recessing a portion of the first sacrificial layer to expose a portion of the first metal layer, resulting in a recessed first sacrificial layer; and
    recessing the portion of the first metal layer, resulting in a recessed first metal layer;
    applying a first line-cut to separate the first metal-gate line into a first sub-metal gate line and a second sub-metal gate line, wherein the applying of the first line-cut to separate the first metal-gate line into the first sub-metal gate line and the second sub-metal gate line includes:
        forming a second sacrificial layer over the recessed first metal layer;
        forming a patterned hard mask over the second sacrificial layer, wherein the patterned hard mask defines an opening;
        etching the second sacrificial layer through the opening; and
        etching the recessed first metal layer through the opening;
    forming a second metal-gate line over the first sub-metal gate line and the second sub-metal gate line, wherein the second metal-gate line extends from the first fin to the second fin;
    applying a second line-cut to separate the second metal-gate line into a third sub-metal gate line and a fourth sub-metal gate line such that a gap is formed between the third sub-metal gate line and the fourth sub-metal gate line; and
    forming an isolation region within the gap.

2. The method of claim 1, further comprising:
    prior to the forming of the first metal-gate line over the first and second gate regions, forming a dummy gate stack over the first and second gate regions; and
    forming an interlayer dielectric (ILD) layer over the substrate, including beside the dummy gate stack.

3. The method of claim 2, wherein forming the first metal-gate line over the first and second gate regions includes:
    prior to the forming of the first metal layer in the first and second gate regions, removing the dummy gate stack to expose a portion of the first gate region and a portion of the second gate region; and
    forming a gate dielectric layer over the portions of the first and second gate regions.

4. The method of claim 1, further comprising:
    after the recessing of the portion of the first metal layer, removing the recessed first sacrificial layer.

5. The method of claim 1, wherein the forming of the second metal-gate line over the first sub-metal gate line and the second sub-metal gate line includes:
    forming a second metal layer over the first sub-metal gate line and the second sub-metal gate line, including over in the first line-cut;
    forming a third sacrificial layer over the second metal layer;
    recessing a portion of the third sacrificial layer to expose a portion of the second metal layer, resulting in a recessed third sacrificial layer;

recessing the portion of the second metal layer, resulting in a recessed second metal layer, wherein a surface of the recessed second metal layer is substantially coplanar with a surface of the recessed third sacrificial layer; and removing the recessed third sacrificial layer.

6. The method of claim 5, wherein the applying of the second line-cut to separate the second metal-gate line into the third sub-metal gate line and the fourth sub-metal gate line includes:

forming a dielectric layer over the recessed second metal layer;

forming a patterned hard mask over the dielectric layer, wherein the patterned hard mask defines an opening;

etching the dielectric layer through the opening; and etching the recessed second metal layer through the opening.

7. The method of claim 6, wherein the forming of the isolation region within the gap includes:

forming another dielectric layer in the gap; and recessing the another dielectric layer.

8. A method comprising:

forming a first fin and a second fin on a substrate, the first fin having a first gate region and the second fin having a second gate region;

forming a first metal-gate line over the first and second gate regions, wherein the first metal-gate line extends from the first fin to the second fin;

forming a first sacrificial layer over the first metal-gate line;

forming a first patterned hard mask over the first sacrificial layer, wherein the first patterned hard mask defines a first opening;

etching the first sacrificial layer through the first opening;

etching the first metal-gate line through the first opening to form a first cut, wherein the first metal-gate line is separated into a first sub-metal gate line and a second sub-metal gate line by the first cut;

forming a second metal-gate line over the first sub-metal gate line, the second sub-metal gate line and the first cut, wherein the second metal-gate line extends from the first fin to the second fin;

forming a dielectric layer over the second metal-gate line;

forming a second patterned hard mask over the dielectric layer, wherein the second patterned hard mask defines a second opening;

etching the dielectric layer through the second opening; and etching the second metal-gate line through the second opening to form a second cut, wherein the second metal-gate line is separated into a third sub-metal gate line and a fourth sub-metal gate line by the second cut.

9. The method of claim 8, further comprising:

forming another dielectric layer in the first cut and the second cut; and recessing the another dielectric layer to form an isolation region.

10. The method of claim 8, further comprising:

prior to the forming of the first metal-gate line over the first and second gate regions, forming a dummy gate stack over the first and second gate regions; and forming an interlayer dielectric (ILD) layer over the dummy gate stack and first source/drain features.

11. The method of claim 10, wherein the forming of the first metal-gate line over the first and second gate regions includes:

removing the dummy gate stack to expose a portion of the first and second gate regions;

depositing a gate dielectric layer over the portions of the first and second gate regions; and depositing a first metal layer over the gate dielectric layer in the first and second gate regions.

12. The method of claim 11, further comprising:

depositing a sacrificial layer over the first metal layer;

recessing a portion of the sacrificial layer to expose a portion of the first metal layer, resulting in a recessed sacrificial layer;

recessing the portion of the first metal layer, resulting in a recessed first metal layer, wherein a surface of the recessed first metal layer is substantially coplanar with a surface of the recessed sacrificial layer; and removing the recessed sacrificial layer.

13. The method of claim 12, wherein the recessing of the portion of the sacrificial layer to expose the portion of the first metal layer includes recessing the sacrificial layer without substantially etching the first metal layer.

14. The method of claim 12, wherein the recessing of the portion of the first metal layer includes recessing the first metal layer without substantially etching the sacrificial layer.

15. The method of claim 12, wherein the forming of the second metal-gate line over the first sub-metal gate line and the second sub-metal gate line includes:

depositing a second metal layer over the first sub-metal gate line and the second sub-metal gate line;

depositing a sacrificial layer over the second metal layer;

recessing a portion of the sacrificial layer to expose a portion of the second metal layer;

recessing the portion of the second metal layer, resulting in a recessed second metal layer, wherein a surface of the recessed second metal layer is substantially coplanar with a surface of the recessed sacrificial layer; and removing the recessed sacrificial layer.

16. A method comprising:

forming a plurality of fins on a substrate, each of the fins having a gate region;

forming dummy gate stack in each gate region;

forming sidewall spacers along sidewalls of each dummy gate stack;

forming an interlayer dielectric (ILD) layer over the substrate, including beside the dummy gate stacks;

removing the dummy gate stacks to expose portions of the fins;

forming a first metal layer over the portions of the fins, wherein the first metal layer forms a first metal-gate line;

forming a first line-cut to cut the first metal-gate line into first sub-metal-gate lines, including:

forming a first sacrificial layer over the first metal-gate line, forming a first patterned hard mask over the first sacrificial layer, wherein the first patterned hard mask has a first opening such that a portion of the first metal layer aligned within the first opening, and etching the first sacrificial layer through the first opening;

forming a second metal layer over first sub-metal-gate lines, including over the first line-cut, wherein the second metal layer forms a second metal-gate line;

forming a second line-cut to cut the second metal-gate line into second sub-metal-gate lines; and forming an isolation region within the first and second line-cuts.

17. The method of claim 16, wherein the forming of the first line-cut to cut the first metal-gate line into first sub-metal-gate lines includes:
after the etching of the first sacrificial layer through the first opening, etching the first metal-gate line through the first opening.

18. The method of claim 16, wherein the forming of the second line-cut to cut the second metal-gate line into second sub-metal-gate lines includes:
forming a dielectric layer over the second metal-gate line;
forming a second patterned hard mask over the dielectric layer, wherein the second patterned hard mask has a second opening such that the first line-cut is aligned within the second opening;
etching the dielectric layer through the second opening; and
etching the second metal layer through the second opening.

19. The method of claim 18, wherein the forming of the isolation region within the first and second line-cuts includes:
forming another dielectric layer in the first line-cut and the second line-cut; and
recessing the another dielectric layer.

20. The method of claim 1, wherein the isolation feature is a dielectric isolation feature disposed within the substrate,
wherein the forming of the first metal layer over the first and second gate regions includes forming the first metal layer over the dielectric isolation feature disposed within the substrate, and
wherein the applying of the first line-cut to separate the first metal-gate line into a first sub-metal gate line and a second sub-metal gate line includes removing a portion of first metal layer to expose the dielectric isolation feature.

* * * * *